(12) United States Patent
Tsuboi et al.

(10) Patent No.: US 8,350,272 B2
(45) Date of Patent: Jan. 8, 2013

(54) SEMICONDUCTOR DEVICE

(75) Inventors: Nobuo Tsuboi, Kanagawa (JP);
Masakazu Okada, Kanagawa (JP)

(73) Assignee: Renesas Electronics Corporation,
Kanagawa (JP)

( * ) Notice: Subject to any disclaimer, the term of this patent is extended or adjusted under 35 U.S.C. 154(b) by 78 days.

(21) Appl. No.: 13/087,118

(22) Filed: Apr. 14, 2011

(65) Prior Publication Data

US 2011/0278592 A1 Nov. 17, 2011

(30) Foreign Application Priority Data

May 12, 2010 (JP) .................................. 2010-110296

(51) Int. Cl.
*H01L 29/12* (2006.01)

(52) U.S. Cl. ... 257/77; 257/183; 257/412; 257/E29.005; 257/E29.068; 257/E29.242

(58) Field of Classification Search .................... 257/77, 257/183, 412, E29.005, E29.068
See application file for complete search history.

(56) References Cited

U.S. PATENT DOCUMENTS

2009/0134473 A1* 5/2009 Tanaka .......................... 257/393

FOREIGN PATENT DOCUMENTS

JP 2009-130238 6/2009

* cited by examiner

*Primary Examiner* — Marc Armand
(74) *Attorney, Agent, or Firm* — McDermott Will & Emery LLP

(57) ABSTRACT

A semiconductor device which is designed based on RDR, suppresses the occurrence of a trouble at the boundary between an active region and a power wire and therearound and is small in size and highly integrated. The semiconductor device includes a first conductive impurity region for functional elements which is formed over the main surface of a semiconductor substrate and a second conductive impurity region for power potential to which power potential is applied in at least one standard cell. It also includes insulating layers which are formed over the main surface of the semiconductor substrate and have throughholes reaching the main surface of the semiconductor substrate, and a conductive layer for contact formed in the throughholes of the insulating layers. The impurity region for functional elements and the impurity region for power potential are electrically coupled to each other through the conductive layer for contact which is formed astride the impurity region for functional elements and the impurity region for power potential.

8 Claims, 22 Drawing Sheets

SEMICONDUCTOR DEVICE

CROSS-REFERENCE TO RELATED APPLICATIONS

The disclosure of Japanese Patent Application No. 2010-110296 filed on May 12, 2010 including the specification, drawings and abstract is incorporated herein by reference in its entirety.

BACKGROUND

The present invention relates to a semiconductor device and, specifically, to a semiconductor device having a plurality of standard cells.

As the performance of a semiconductor device is becoming higher and higher, efforts are being made to reduce the size and increase the integration of the semiconductor device. To obtain a small-sized highly integrated semiconductor device, layout design for achieving a smaller cell width and a smaller cell height is becoming the mainstream in this field. In the case of SRAM (Static Random Access Memory) which is a type of volatile memory, like an integrated circuit disclosed by Japanese Unexamined Patent Publication No. 2009-130238 (Patent Document 1), linear load transistors and active regions are inclined at a certain angle with respect to the extension direction of standard cells in a plan view. This structure provides high integration as compared to an integrated circuit in which all of the above load transistors and active regions are not inclined in the extension direction of the standard cells, thereby reducing the size of the standard cells.

SUMMARY

In the design of a semiconductor device, particularly after the 45 nm generation, a design technique called "RDR (Restrictive Design Rule)" has been employed or studied. Stated more specifically, RDR is a very strict design rule and employs one-dimensional layout which prohibits bending and curving in place of two-dimensional layout in which a metal wire and a polycrystalline silicon wire is bent or curved. Thereby, variations caused by the dependence on shape of transistors and wires are suppressed, and EDA (Electronics Design Automation) burdens such as DRC (Design Rule Check), OPC (Optical Proximity Correction) and lithography check are reduced. That is, the occurrence of variations in lithography and the complication of design can be suppressed by RDR. In other words, according to RDR, like SRAM of Japanese Unexamined Patent Publication No. 2009-130238, load transistors and active regions are preferably not bent in the plan view.

Meanwhile, as a process technique for the reduction of size and the increase of integration, so-called "butting diffusion structure" in which the active regions (such as source/drain regions) of main transistors and active regions to which a power potential is applied are directly coupled to each other is often used. When this butting diffusion structure is used, as compared to a case in which they are coupled to each other by means of contact electrodes and metal wires as shown in Japanese Laid-open Patent Application No. 2009-130238, it is easy to arrange gate electrodes at a narrower pitch than the pitch of the contact electrodes.

However, when the butting diffusion structure is used, an area surrounded by the active regions and the power wires in three directions in the plan view is formed. In this area surrounded by the active regions in three directions, it is made difficult to bury an STI (Shallow Trench Isolation) insulating film by the rounding of the active regions, and the active regions are apt to vary in planar shape.

In the butting diffusion structure, p type source/drain regions formed in an n type well are coupled to an $n^+$ impurity region for applying a power potential to the n type well with the result that a pn junction is formed between them. Therefore, according to the condition of applying voltage to the power wires, a depletion layer is formed at the boundary between the p type source/drain regions and the $n^+$ impurity region with the result that the butting diffusion structure may cause disconnection. That is, a problem may occur in the wiring of the butting diffusion structure.

It is an object of the present invention which has been made in view of the above problem to provide a semiconductor device which is designed based on RDR, suppresses the occurrence of a trouble at the boundary between the active region and the power wire and therearound and is small in size and highly integrated.

A semiconductor having a plurality of standard cells according to an embodiment of the present invention has the following structure.

The above semiconductor device includes a semiconductor substrate having a main surface. The above semiconductor device includes a first conductive impurity region for functional elements which is formed over the main surface of the semiconductor substrate in at least one of the standard cells and forms functional elements and a second conductive impurity region for power potential which is formed over the main surface of the semiconductor substrate in at least one of the standard cells and to which power potential is applied. The above semiconductor device includes insulating films which are formed over the main surface of the semiconductor substrate and have throughholes reaching the main surface of the semiconductor substrate and a conductive layer for contact which is formed in the throughholes of the insulating layers. Since the conductive layer for contact is formed astride the above impurity region for functional elements and the impurity region for power potential, the impurity region for functional elements and the impurity region for power potential are electrically coupled to each other through the conductive layer for contact.

A semiconductor device having a plurality of standard cells according to another embodiment of the present invention has the following structure.

The above semiconductor device includes a semiconductor substrate having a main surface. The above semiconductor device has a pair of source/drain regions for transistors which are spaced apart from each other over the main surface of the semiconductor substrate. The above semiconductor device has a transistor gate electrode formed over the main surface of the semiconductor substrate and sandwiched between the pair of source/drain regions, and first and second power wires which are formed above the gate electrode over the main surface of the semiconductor substrate and separate from each other in at least one of the standard cells, and a conductive layer for coupling which is separate from the same layer as the gate electrode. The above conductive layer for coupling is separate from the same layer as the gate electrode and made of the same material as the gate electrode. The first and second power wires and the conductive layer for coupling extend in the same direction. In the plan view, part of the first power wire and part of the conductive layer for coupling are overlapped with each other, and part of the second power wire and part of the conductive layer for coupling are overlapped with each other. The first and second power wires are electrically coupled to each other through the conductive layer for coupling.

In the semiconductor device according to the embodiment of the present invention, the impurity region for functional elements and the impurity region for power potential are electrically coupled to each other through the conductive layer for contact. Therefore, even when disconnection occurs at the boundary between the impurity region for functional elements and the impurity region for power potential, conduction between the impurity region for functional elements and the impurity region for power potential can be secured through the conductive layer for contact.

In the semiconductor device according to the other embodiment of the present invention, the power wire is divided into first and second power wires. Therefore, the area surrounded by the power wires and the active regions in three directions in the plan view becomes small. Therefore, it is easy to bury the insulating layer near the power wires and the active regions, thereby suppressing variations in the shapes of the power wires and the active regions.

DETAILED DESCRIPTION

Preferred embodiments of the present invention will be described hereinunder with reference to the accompanying drawings.

First Embodiment

Figure 1:
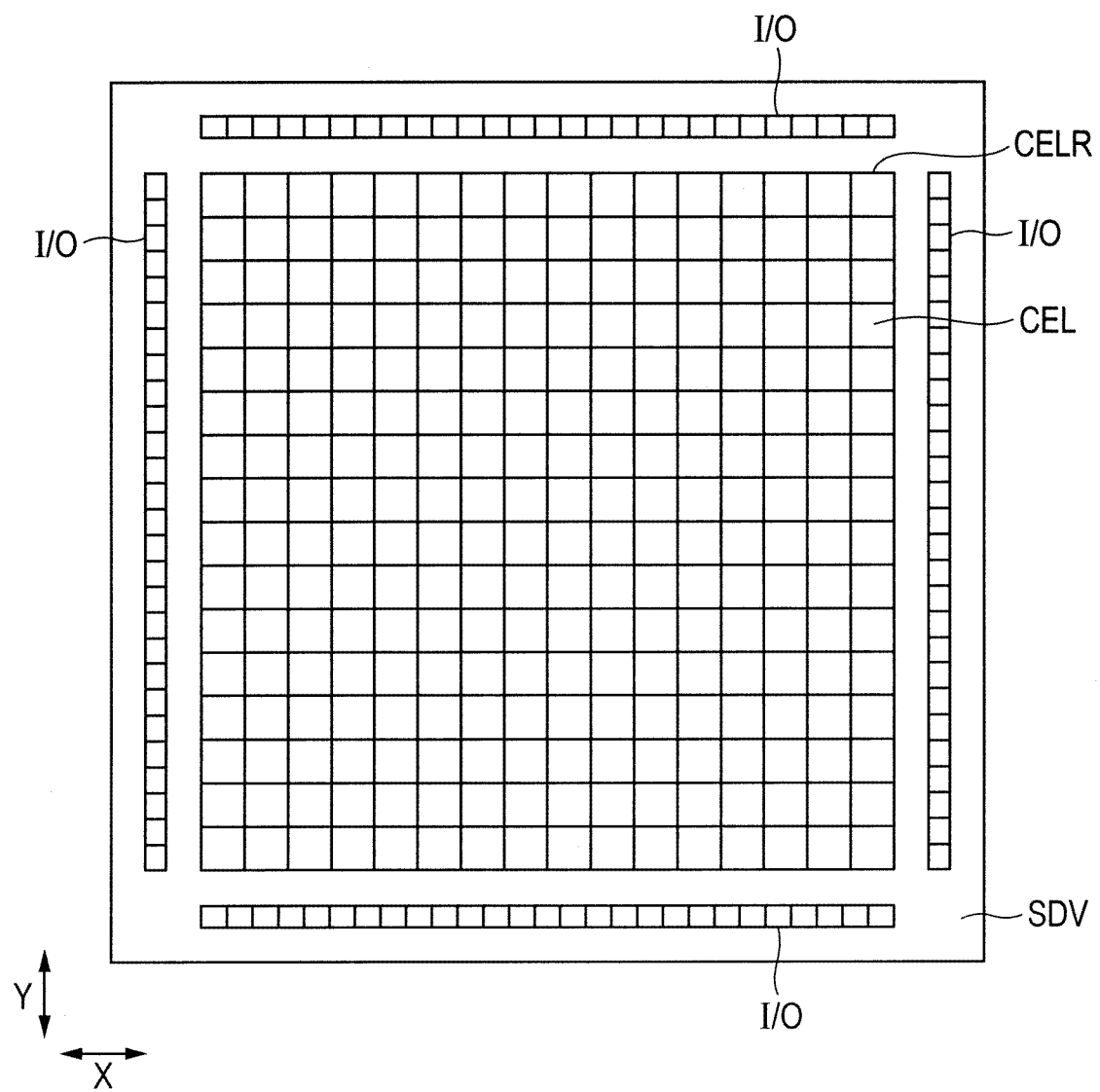
FIG. 1 is a schematic plan view showing the configuration of a semiconductor device according to First Embodiment of the present invention.

With reference to FIG. 1, a semiconductor device SDV (for example, a semiconductor chip) has a standard cell region CELR, I/O (Input/Output) cell regions I/O arranged around the standard cell region CELR and a pad (not shown) used for input/output from the outside as the main components on the surface.

The standard cell region CELR has a plurality of standard cells CEL which are arranged in an X direction and a Y direction orthogonal to this X direction in a matrix form in the figure. Each of the standard cells CEL is surrounded by outer rims which extend in the X direction and are opposed to each other and outer rims which extend in the Y direction and are opposed to each other. The standard cell is a basic logic cell arranged by an automatic arrangement technique to achieve a desired function in the semiconductor device. In SOC (System On Chip) using a standard cell library, a CPU (Central Processing Unit), RAM (Random Access Memory), FIFO (First-In First-Out), SCSI (Small Computer System Interface) and SOG (Sea Of Gate) are formed in this standard cell region CELR.

Figure 2:
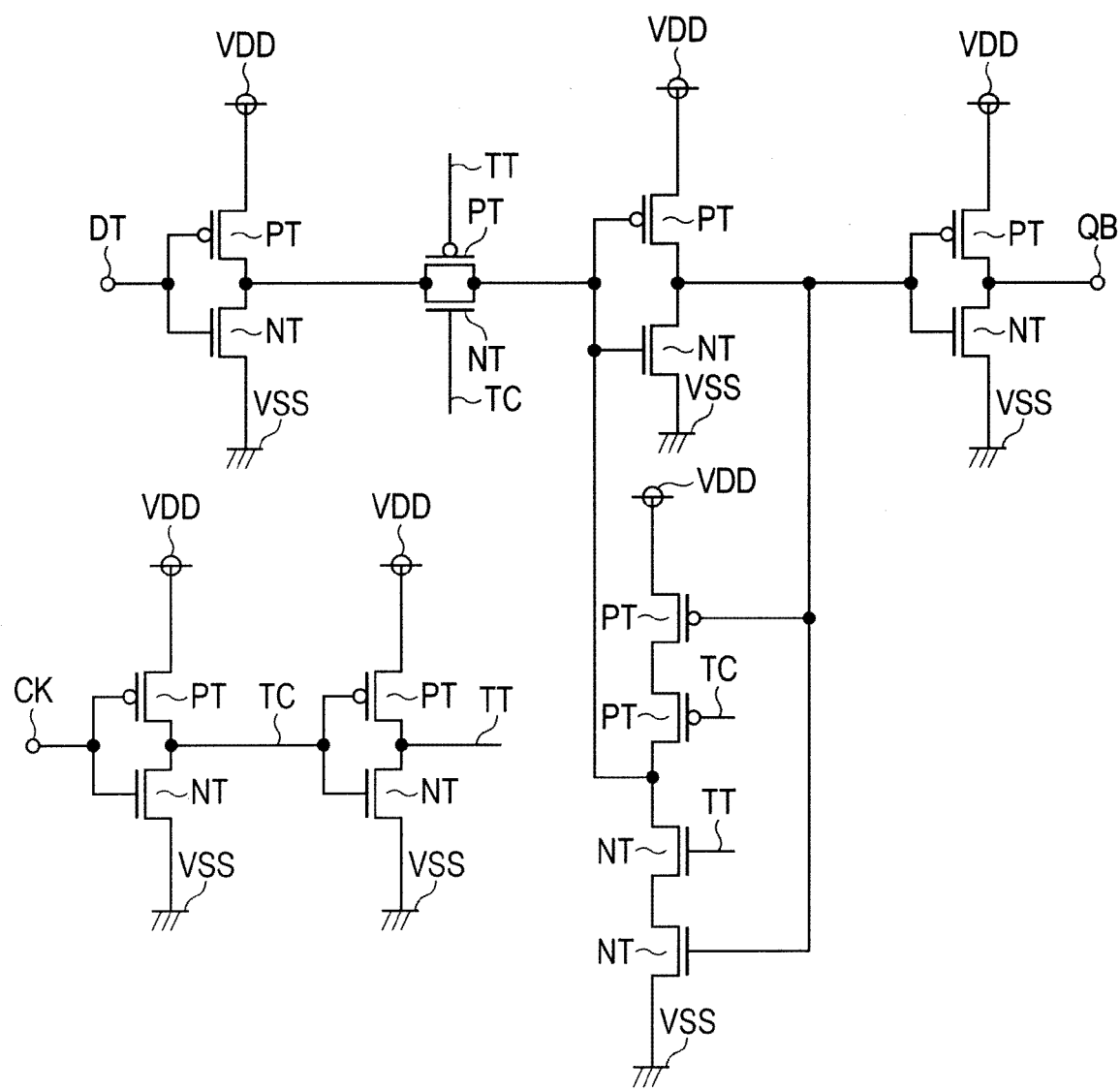
FIG. 2 is a circuit diagram showing the circuit configuration of functional elements formed in one of a plurality of standard cells shown in FIG. 1.

With reference to FIG. 2, the circuit of a functional element to be formed in this standard cell CEL is, for example, a flip-flop. This flip-flop has a data input terminal DT, an output terminal QB, a clock terminal CK, power terminals VDD and VSS, pMIS (Metal Insulator Semiconductor) transistors PT and nMIS transistors NT. In this figure, a plurality of wires TC are electrically coupled to one another. Also, a plurality of wires TT are electrically coupled to one another.

Figure 3:
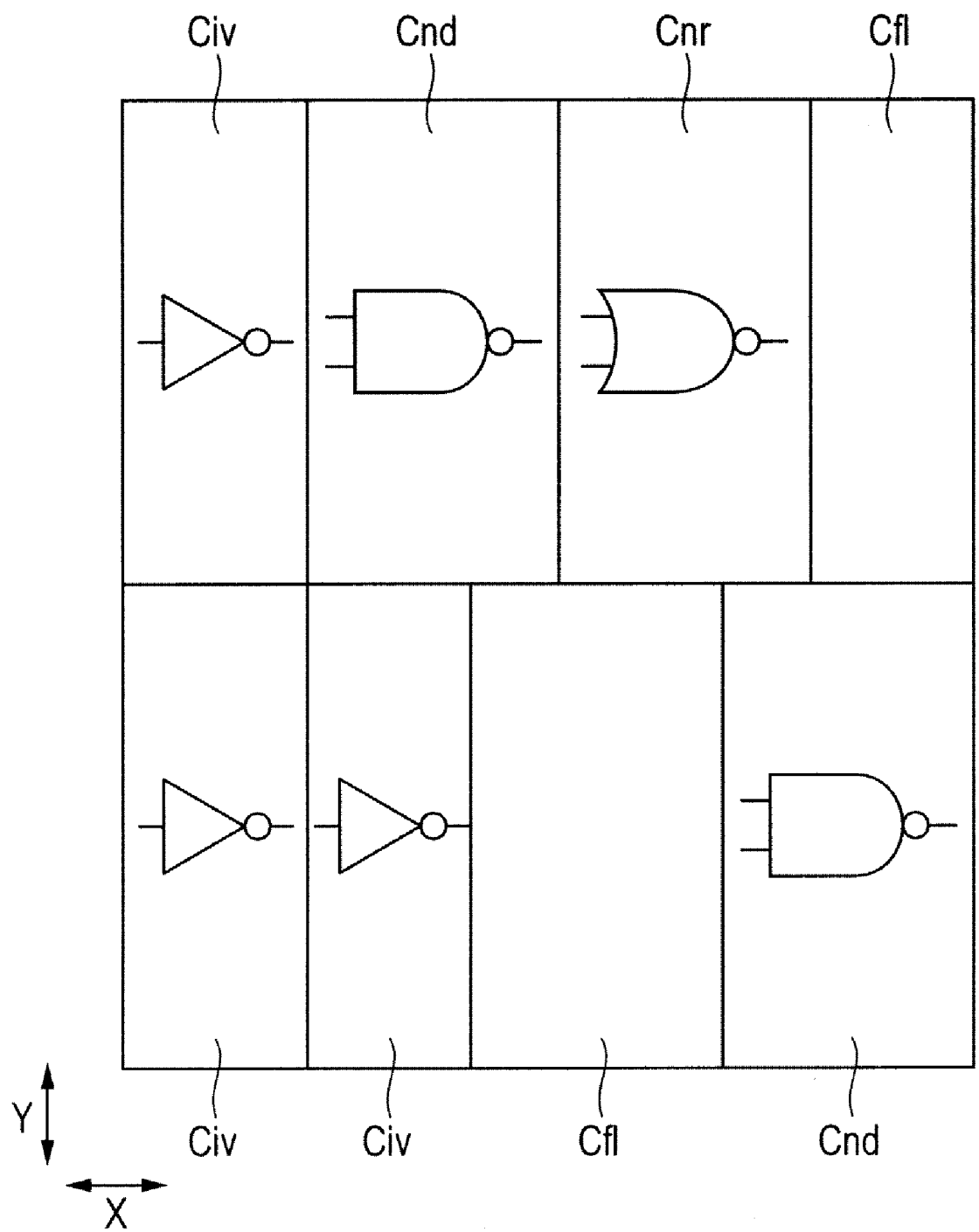
FIG. 3 is a schematic diagram showing the arrangement of the standard cells of the semiconductor device according to First Embodiment of the present invention.

With reference to FIG. 3, the semiconductor device of this embodiment has standard cells Civ, Cnd, Cnr and Cfl. The standard cells Civ, Cnd, Cnr and Cfl are arranged in a plurality of tiers in the X direction in the figure.

The standard cells Civ, Cnd and Cnr are for achieving invertor, 2NAND and 2NOR functions, respectively. 2NAND is a NAND having two input systems and 2NOR is a NOR having two input systems. The standard cell Cfl is a filler cell (gap cell).

Figure 4:
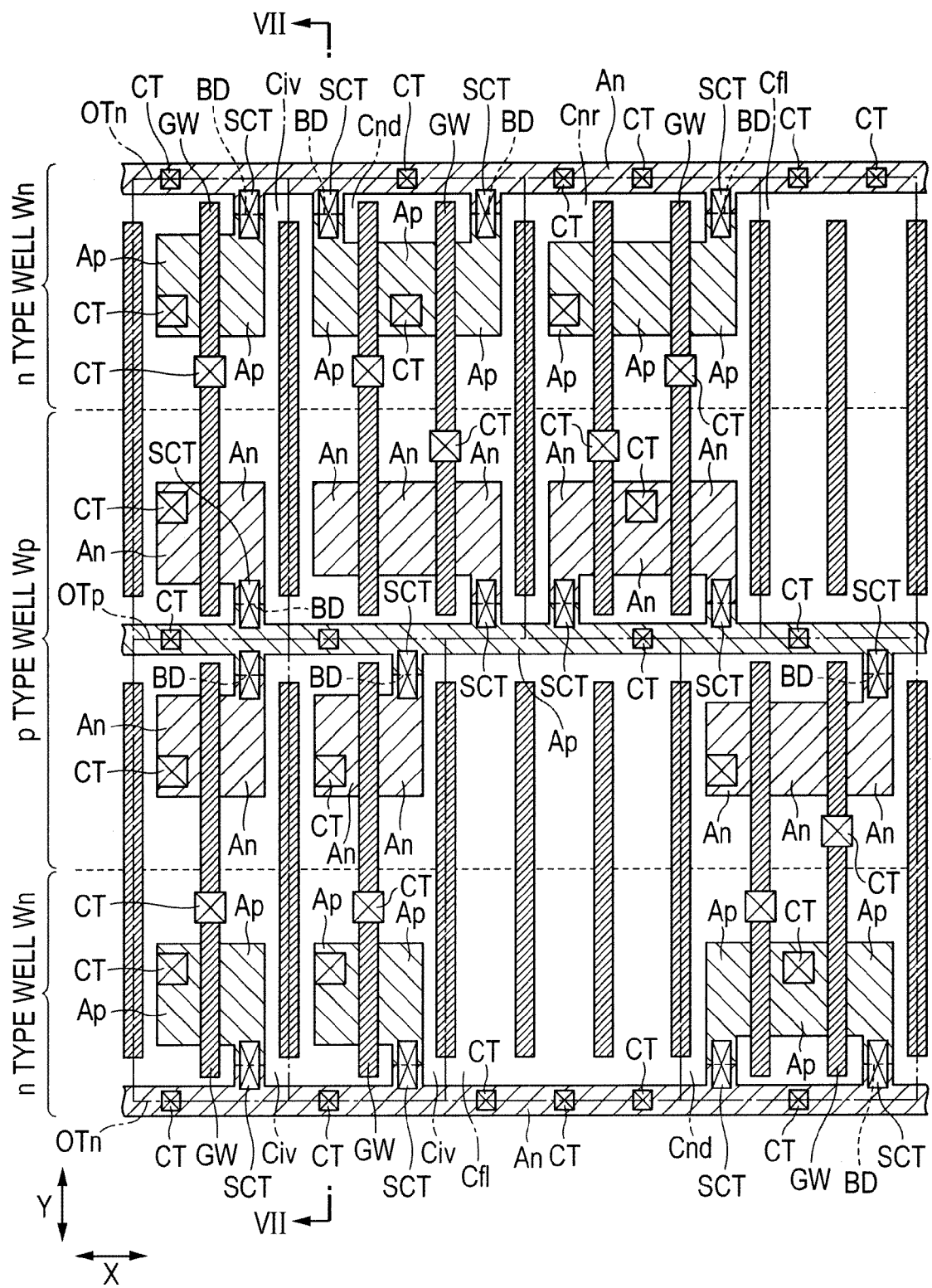
FIG. 4 is a schematic plan view showing the configurations of the first layer of the standard cells and the semiconductor substrate of the semiconductor device of First Embodiment of the present invention.
Figure 5:
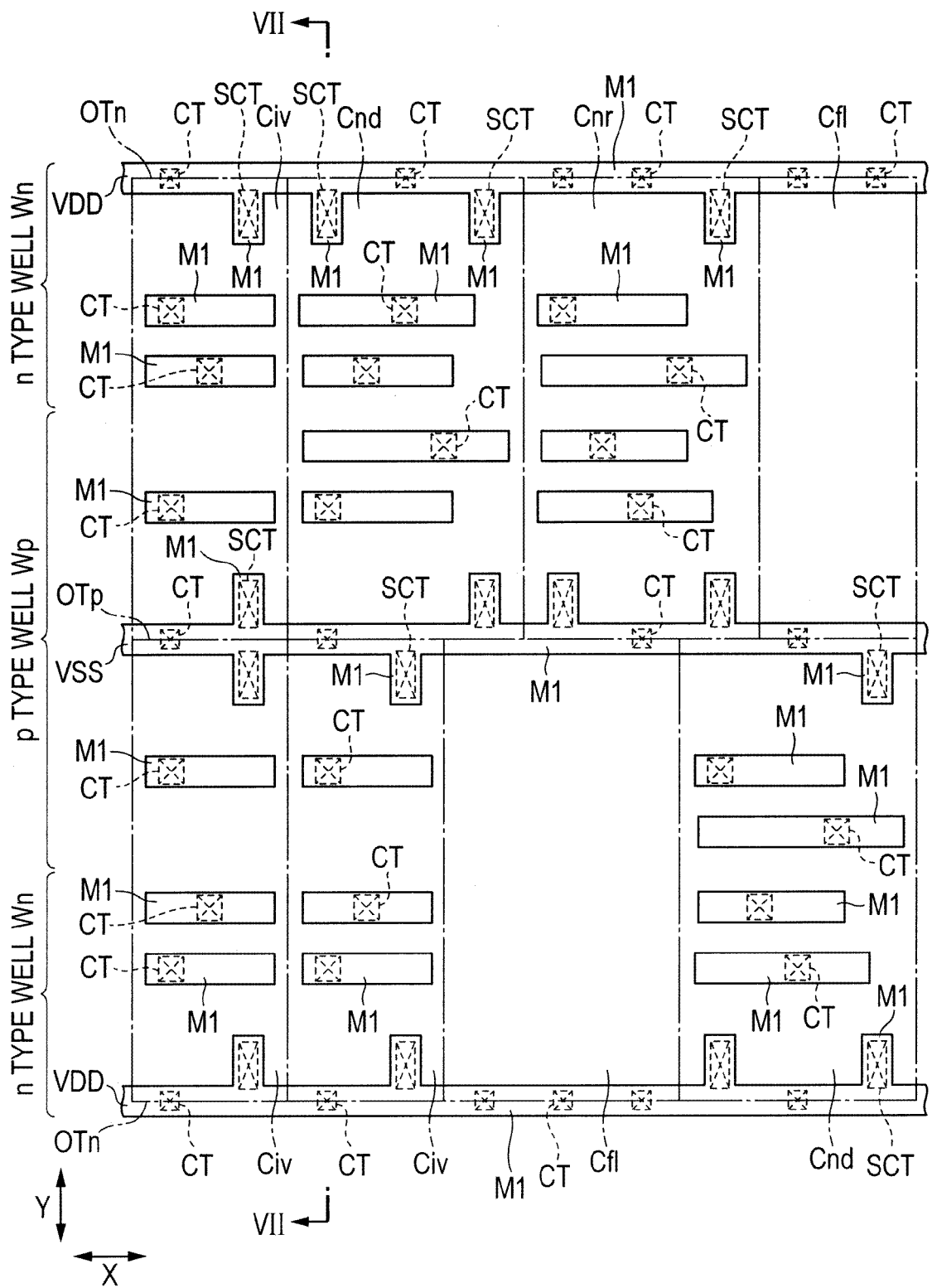
FIG. 5 is a schematic plan view showing the configuration of the second layer of the standard cells shown in FIG. 4.
Figure 6:
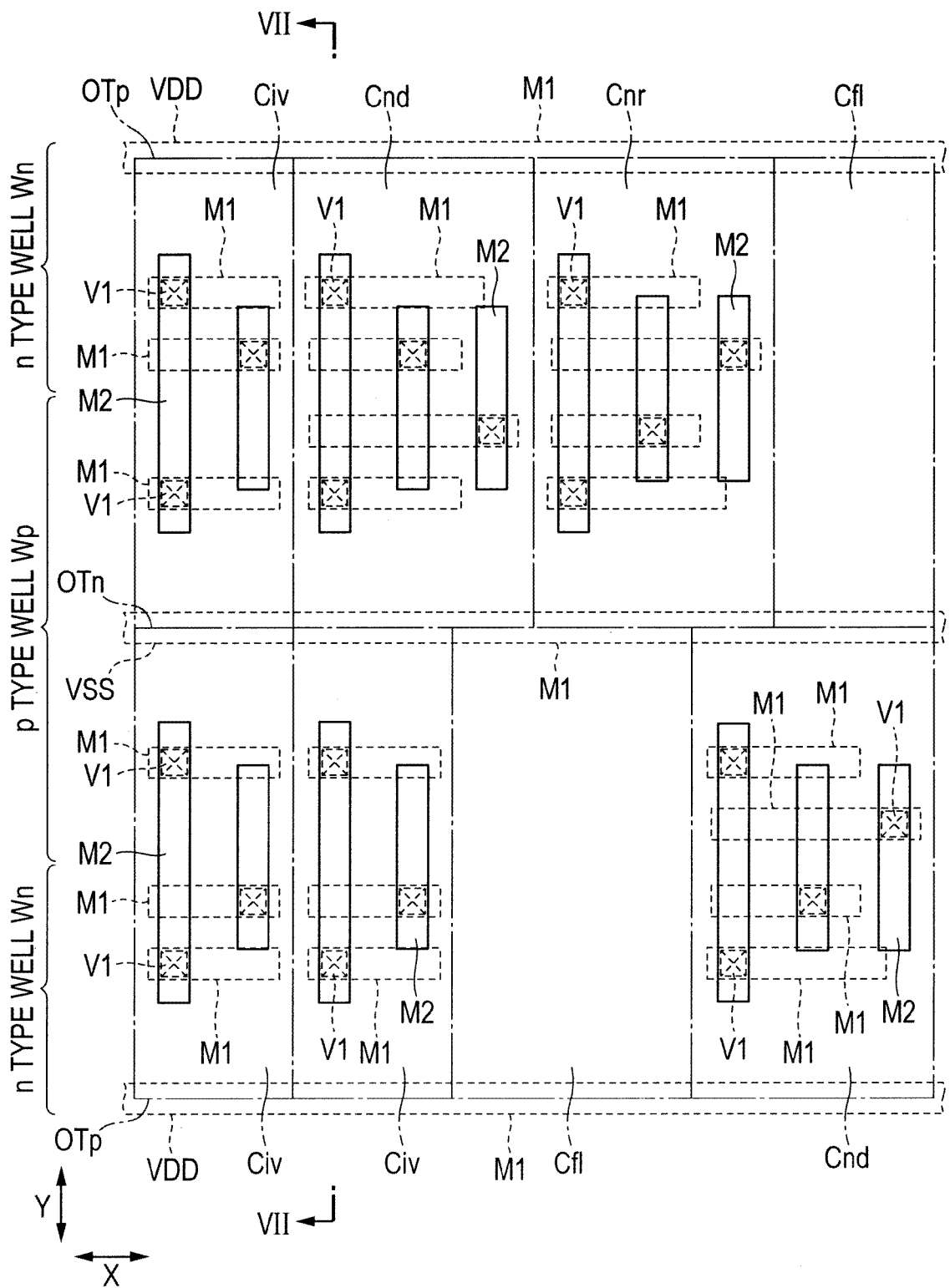
FIG. 6 is a schematic plan view showing the configuration of the third layer of the standard cells shown in FIG. 4.

With reference to FIGS. 4 to 6, the standard cells Civ, Cnd, Cnr and Cfl are arranged in the same manner as in FIG. 3 in these figures and the planar areas of the standard cells Civ, Cnd, Cnr and Cfl are partitioned by one-dotted chain lines. As described above, FIG. 7 is a schematic sectional view cut on line VII-VII of FIGS. 4 to 6.

Figure 7:
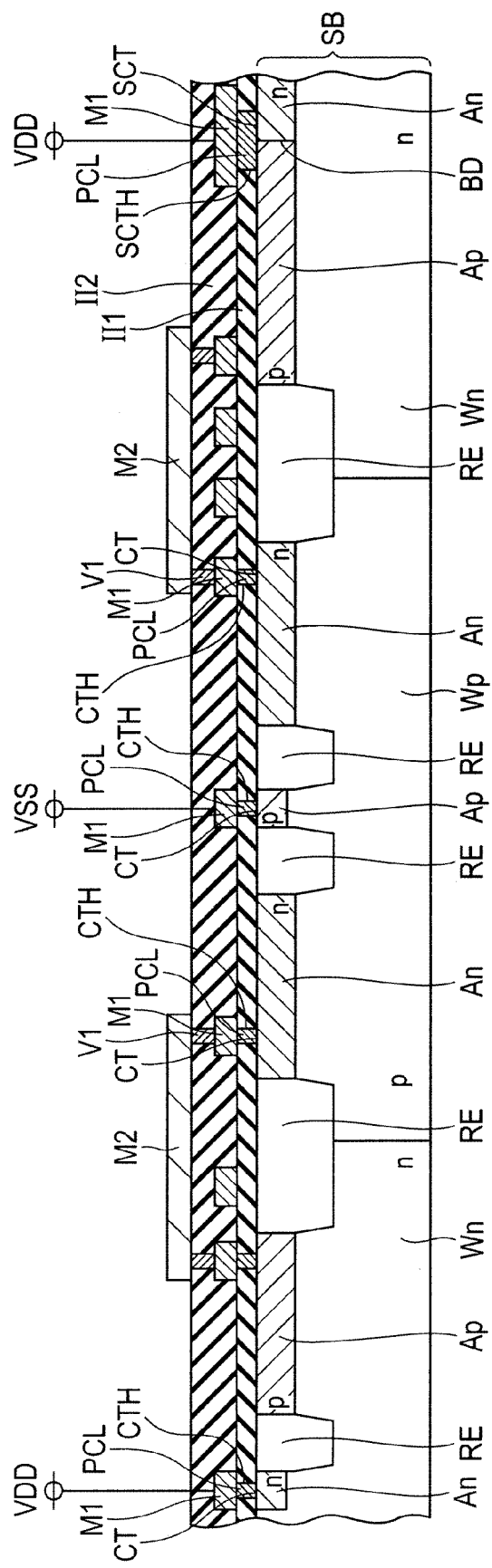
FIG. 7 is a schematic partial sectional view cut on line VII-VII in FIGS. 4 to 6 of the semiconductor device according to First Embodiment of the present invention.

FIG. 4 is a plan view showing a relatively lower layer in FIG. 7, that is, a semiconductor substrate SB, n type active regions An and p type active regions Ap (impurity regions for functional elements), contact portions CT and contact portions SCT which are formed over the main surface of the semiconductor substrate SB, and gate wires GW (gate electrodes) not shown in FIG. 7. The main surface means a surface having a largest area out of the surfaces of the semiconductor substrate SB.

FIG. 5 is a plan view showing an intermediate layer in FIG. 7, that is, first metal wires M1 and contact portions CT and SCT. The first metal wires M1 include transistor coupling wires and power wires (VDD wires, VSS wires) VDD and VSS. Further, FIG. 6 is a plan view showing a relative upper layer in FIG. 7, that is, second metal wires M2 and vias V1. In the plan views of FIG. 5 and FIG. 6, the contact portions CT and the first metal wires M1 arranged right below are shown by dotted lines.

With reference to FIG. 4 and FIG. 7, in the standard cells Civ, Cnd, Cnr and Cfl, n type well regions Wn and p type well regions Wp are formed in the semiconductor substrate SB. The n type well regions Wn and the p type well regions Wp extend like a band in the X direction of FIG. 4 over the main surface of the semiconductor substrate SB, and the n type well regions Wn and the p type well regions Wp region are arranged alternately in the Y direction of FIG. 4. Thereby, the planar area of each standard cell is divided into the n type well region Wn and the p type well region Wp in the Y direction. Adjacent standard cells in the Y direction share either one of the n type well region Wn and the p type well region Wp.

In FIG. 4, an STI region RE in which a separation insulation film is buried is formed in a trench devoice of the n type well region Wn and the p type well region Wp. As shown in FIG. 7, the trench of this STI region RE is deeper than the n type active region An and the p type active region Ap and shallower than the n type well region Wn and the p type well region Wp.

A plurality of pMIS transistors as functional elements and an n type impurity region An for power potential are formed over the main surface of the semiconductor substrate SB in the n type well region Wn. Each of the pMIS transistors has a pair of p type source/drain regions Ap, a gate insulating layer (not shown) and a gate wire GW. The pair of p type source/drain regions Ap are spaced apart from each other over the main surface of the semiconductor substrate SB. The gate wire GW is formed over an area sandwiched between the pair of p type source/drain regions Ap through the gate insulating layer.

The gate wires GW extend linearly in the Y direction at equal intervals. The n type impurity region An for power potential is formed over the main surface of the semiconductor substrate SB in such a manner that it extends in the X direction along one (outer rim OTn) of the opposed sides in the Y direction of each standard cell. The n type impurity region An for power potential extending in the X direction extends continuously in the standard cells arranged in the X direction and is shared by adjacent standard cells in the Y direction.

Similarly, a plurality of nMIS transistors as functional elements and a p type impurity region Ap for power potential are formed over the main surface of the semiconductor substrate SB in the p type well region Wp. Each of the nMIS transistors has a pair of n type source/drain regions An, a gate insulating layer (not shown) and a gate wire GW. The gate wire GW is formed over an area sandwiched between the pair of n type source/drain regions An through the gate insulating layer.

The gate wires GW extend linearly in the Y direction at equal intervals. The p type impurity region Ap for power potential is formed over the main surface of the semiconductor substrate SB in such a manner that it extends in the X direction along one side (outer rim OTp) of the opposed sides in the Y direction of each standard cell. The p type impurity region Ap for power potential extending in the X direction extends continuously in the standard cells arranged in the X direction and is shared by adjacent standard cells in the Y direction.

The first outer rim OTn and the second rim OTp described above are center lines in the plan view of the impurity regions An and Ap for power potential which extend linearly, respectively.

The gate wires GW may be made of polycrystalline silicon or a metal material containing at least one of titanium and copper. The gate insulating layer may be composed of a silicon oxide film or made of a High-k dielectric material.

An insulating layer II1 is formed over the main surface of the semiconductor substrate SB to cover the MIS transistors and the impurity regions An and Ap for power potential. This insulating layer II1 is, for example, a silicon oxide film formed, for example, by a CVD (Chemical Vapor Deposition) method. A plurality of contact holes (throughholes) CTH and SCTH reaching the main surface of the semiconductor substrate SB are formed in this insulating layer II1. The contact holes CTH include contact holes CTH reaching the surfaces of the source/drain regions An and Ap and contact holes CTH reaching the surfaces of the gate wires GW. The contact holes SCTH include contact holes SCTH reaching both the surface of the n type impurity region An for power potential and the p type source/drain regions Ap and contact holes SCTH reaching both the surfaces of the p type impurity region Ap for power potential and the n type source/drain regions An.

The contact holes CTH and SCTH are filled with a contact layer PCL (conductive layer for contact) made of a metal. The contact layer PCL in the contact holes CTH is in contact with the source/drain regions An and AP or the gate wire GW to form a contact portion CT. The contact layer PCL in the contact holes SCTH reaching both the surfaces of the n type impurity region An for power potential and the p type source/drain regions Ap is in contact with both the n type impurity region An for power potential and the p type source/drain regions Ap to form a contact portion SCT. Thereby, the n type impurity region Ap and the p type source/drain regions Ap are electrically coupled to each other through the contact layer PCL. The contact layer PCL in the contact holes SCTH reaching the surfaces of the p type impurity region Ap for power potential and the n type source/drain regions An is in contact with the p type impurity region Ap for power potential and the n type source/drain regions An to form a contact portion SCT. Thereby, the p type impurity region Ap for power potential and the n type source/drain regions An are electrically coupled to each other through the contact layer PCL.

In this embodiment, the n type impurity region An for power potential and the p type source/drain regions Ap are directly coupled to each other and the p type impurity region Ap for power potential and the n type source/drain regions An are directly coupled to each other right below the contact portions SCT.

Preferably, the n type source/drain regions An described above are made of SiC and the p type source/drain regions Ap are made of SiGe. By using these materials, current drive capability in these active regions is improved.

The n type impurity region An for power potential and the p type impurity region Ap for power potential are preferably made of, for example, Si. The functions of these impurity regions for power potential extending linearly are stabilized by this.

With reference to FIG. 5 and FIG. 7, a plurality of first metal wires M1 are formed over the insulating layer II1. The first metal wires M1 extend in a direction (X direction) crossing the gate wires GW in the plan view. The first metal wires M1 include first wires M1 for power potential and first wires M1 for coupling. The first wires M1 for power potential include VDD wires M1 to which VDD potential is applied and VSS wires M1 to which VSS potential is applied.

The VDD wires M1 extend right above the n type impurity regions An for power potential in the plan view, whereby they extend in the X direction along the outer rim OTn. The VDD wires M1 extend continuously in the standard cells arranged in the X direction and are shared by adjacent standard cells in the Y direction. The VDD wires M1 are electrically coupled to both the n type impurity regions An for power potential and the p type source/drain regions Ap through the contact holes CTH and SCTH.

The VSS wires M1 extend right above the p type impurity regions Ap for power potential in the plan view, whereby they extend in the X direction along the outer rim OTp. The VSS wires M1 extend continuously in the standard cells arranged in the X direction and are shared by adjacent standard cells in the Y direction. The VSS wires M1 are electrically coupled to the p type impurity regions Ap for power potential and the n type source/drain regions An through the contact holes CTH and SCTH.

Each of the first wires M1 for coupling is electrically coupled to the source/drain regions An and Ap or the gate wire GW through the contact hole CTH.

With reference to FIG. 6 and FIG. 7, an insulating layer II2 is formed over the insulating layer II1 to cover the first metal wires M1. A plurality of via holes V1 reaching the first metal wires M1 are formed in this insulating layer II2. Each of the via holes V1 is filled with a conductive layer.

A plurality of second metal wires M2 are formed over the insulating layer II2. The second metal wires M2 extend in the same direction (Y direction) as the gate wires GW in the plan view. The second metal wires M2 are electrically coupled to the first metal wires M1 through the via holes V1.

Figure 8:
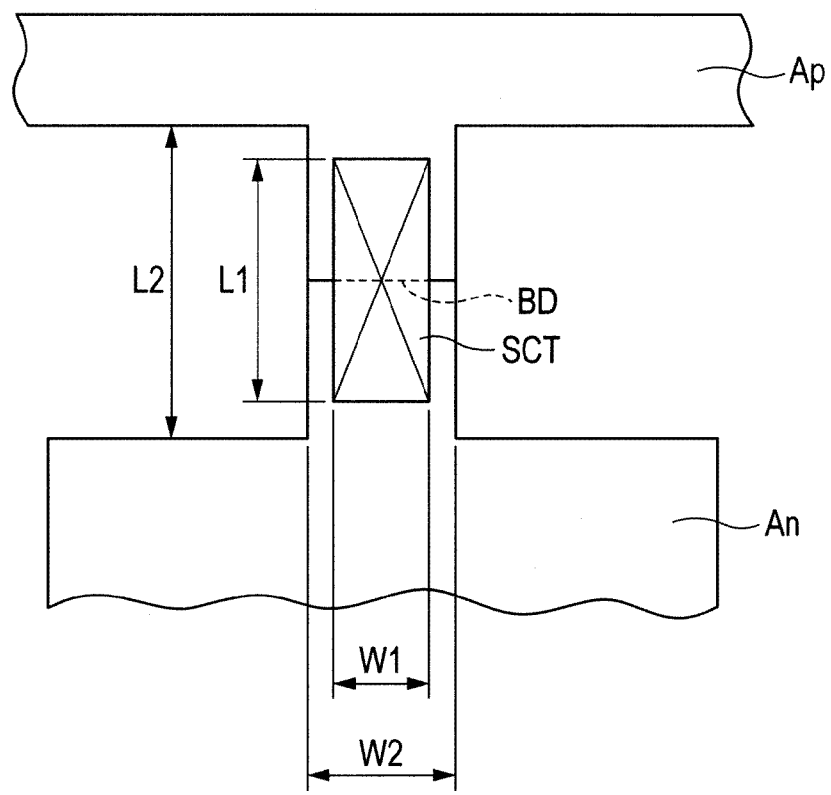
FIG. 8 is a schematic partial plan view showing an example of a contact portion formed in the semiconductor device according to First Embodiment of the present invention.

Preferably, the contact portions CT and the contact portions SCT do no project from an area where the impurity region for power potential and the impurity region for functional elements are formed and are situated within the area in the plan view. More specifically, for example, as shown in FIG. 8, the contact portion SCT in contact with a junction portion BD between the n type active region An and the p type impurity region Ap for power potential is preferably situated within the n type active region An and the p type impurity region Ap for power potential. That is, the contact hole SCTH for forming the contact portion SCT is preferably formed within the n type active region An and the p type impurity region Ap for power potential in the plan view.

In this case, the width W1 in the transverse direction in FIG. 8 of the contact portion SCT is preferably smaller than the width W2 of the n type region An or the p type region Ap near the junction portion BD. When the width W1 is made smaller than the width W2 and the contact portion SCT is situated within the active regions, if a contact shift occurs, it is possible to suppress the chipping of the STI region RE at the time of forming the contact hole SCTH. Therefore, it is possible to suppress a leak current from flowing between the contact portion SCT and the well region of the active regions.

Figure 9:
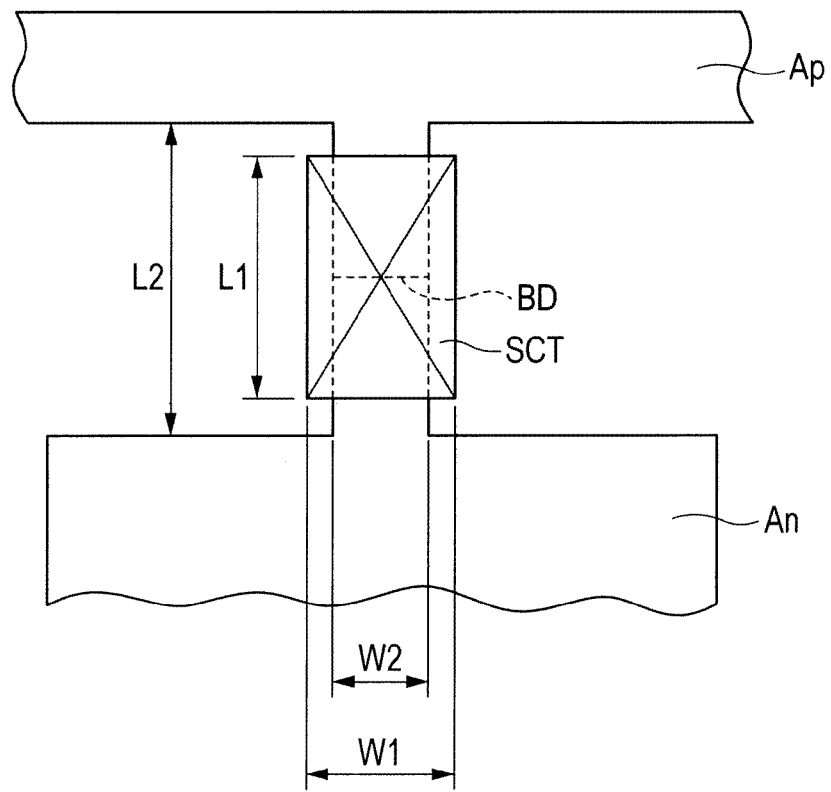
FIG. 9 is a schematic partial plan view showing an example different from that of FIG. 8 of a contact portion formed in the semiconductor device according to First Embodiment of the present invention.

As a modification, for example, as shown in FIG. 9, the width W1 in the transverse direction in FIG. 9 of the contact portion SCT may be larger than the width W2 of the n type region An or the p type region Ap near the junction portion BD. In FIG. 9, the width L1 in the longitudinal direction in FIG. 9 of the contact portion SCT is smaller than the total width L2 of the n type region An and the p type region Ap near the junction portion BD. However, as shown in FIG. 10, for example, the width W1 in the transverse direction in FIG. 9 of the contact portion SCT may be larger than the width W2 of the n type region An or the p type region Ap near the junction portion BD and the width L1 in the longitudinal direction in FIG. 10 may be larger than the total width L2 of the n type region An and the p type region Ap near the junction portion BD.

When the semiconductor elements are becoming finer and faster, it is difficult to form fine contact holes SCTH and to form small contact holes SCTH over the active regions An and Ap in such a manner that they do not overlap with the STI region RE in the plan view. Therefore, the contact portions SCT as shown in FIG. 9 and FIG. 10 projecting from the active regions An and Ap are formed. However, when the contact portion SCT overlapping with the STI region RE is formed, the STI region RE is chipped at the time of forming the contact hole SCTH and a junction leak (a leak current at the junction portion) occurs between the well region and the contact portion SCT.

Figure 10:
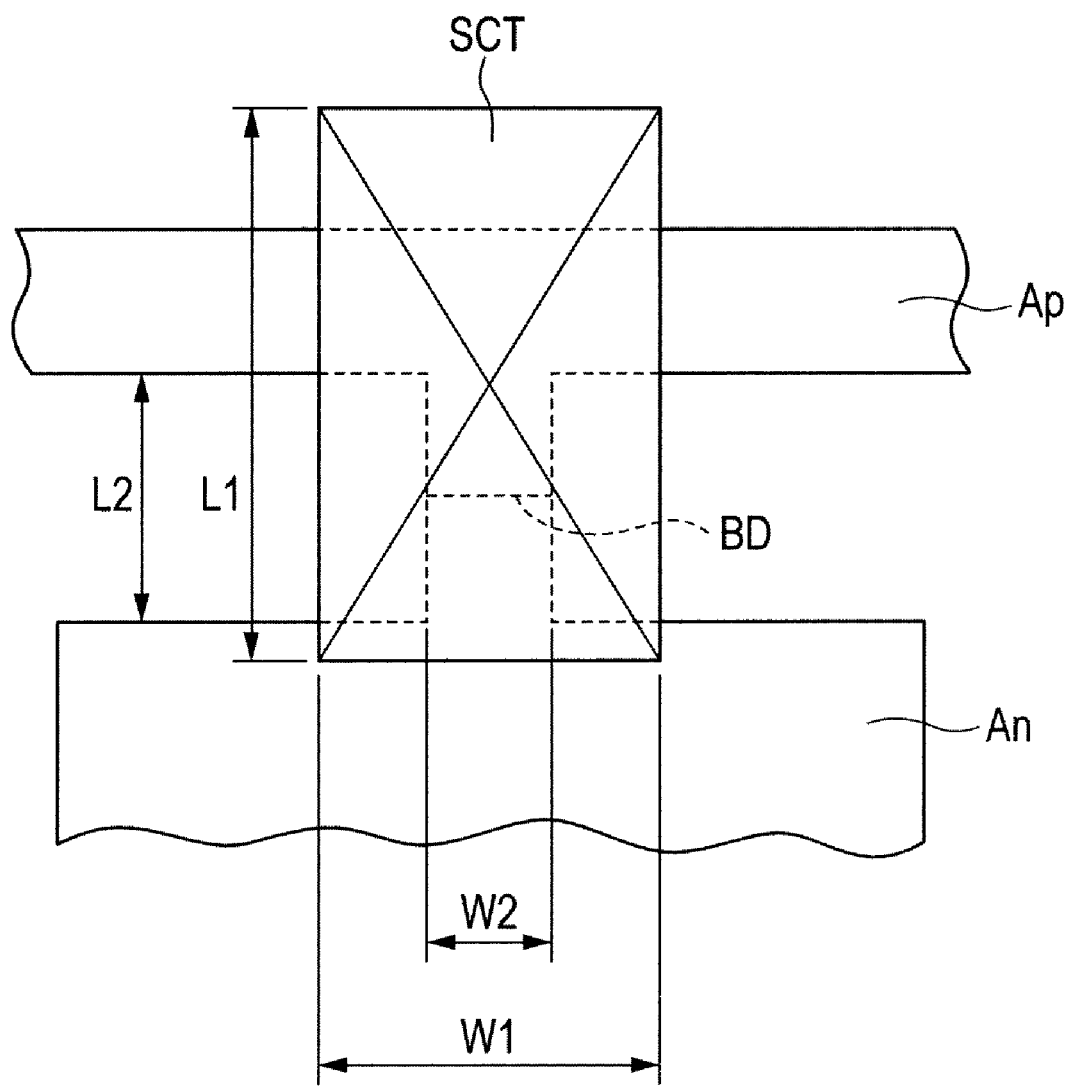
FIG. 10 is a schematic partial plan view showing an example different from that of FIG. 9 of a contact portion formed in the semiconductor device according to First Embodiment of the present invention.

Then, when contact portions SCT as shown in FIG. 9 and FIG. 10 are to be formed, at least active regions (impurity regions An and Ap for power potential, n type source/drain regions An and p type source/drain regions Ap) near the contact portions SCT are preferably higher than the Si surface which is the main surface of the semiconductor substrate SB on which functional element are to be formed. To this end, it is preferred that the impurity region An for power potential and the n type source/drain regions An should be made of SiC and the impurity region Ap for power potential and the p type source/drain regions Ap should be made of SiGe.

Then, the depth of the contact hole SCTH can be made small, and even when it overlaps with the STI region RE, the chipping of the STI region RE can be suppressed at the time of forming the contact hole SCTH. Therefore, the occurrence of the above junction leak can be suppressed.

Figure 11:
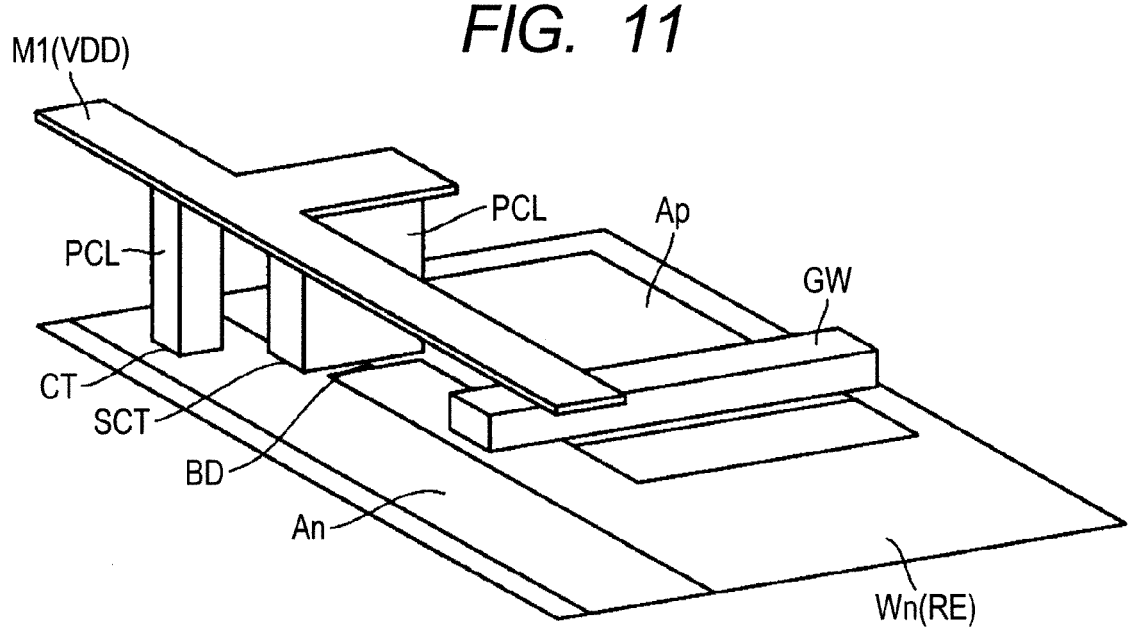
FIG. 11 is a detailed perspective view showing the configuration of an area in which an n type impurity region and a p type impurity region are coupled to each other in the semiconductor device according to First Embodiment of the present invention.

FIG. 11 is a schematic perspective view of a portion where the n type region An (n type impurity region for power potential) and the p type region Ap (p type impurity region for functional elements as an active region such as source/drain regions) in the n type well region Wn out of the circuits shown in FIGS. 4 to 7 are coupled to each other. With reference to FIG. 11 and FIGS. 4 and 5, the linear n type impurity region An for power potential and the p type impurity region Ap for functional elements are joined together at the junction portion BD.

In FIG. 11, a contact layer PCL for electrically coupling the above impurity region An for power potential and the impurity region Ap for functional elements to each other is formed. The lowermost part of this contact layer PCL is a contact portion SCT which is in contact with both the impurity region An for power potential and the impurity region Ap for functional elements.

The uppermost part of the contact layer PCL having this contact portion SCT is coupled to a power wire M1 to which VDD is applied. This power wire M1 is electrically coupled to the impurity region An for power potential by the contact layer PCL having the contact portion CT which is the lowermost part. A power wire M1 to which VSS is applied is also electrically coupled to the impurity region Ap for power potential and the impurity region An for functional elements like the power wire to which VDD is applied.

In FIG. 11, the insulating layers II1 and II2, the semiconductor substrate SB, the via holes V1 and the wires M2 are not shown.

A description is subsequently given of the function and effect of the semiconductor device SDV of this embodiment with reference mainly to FIG. 11 and FIG. 12.

In the semiconductor device SDV of this embodiment, for example, as shown in FIG. 11, the impurity region Ap for functional elements and the impurity region An for power potential are coupled to each other at the junction portion BD. FIG. 12 for comparison is different from FIG. 11 only in that the contact layer PCL having the contact portion SCT is not formed.

Figure 12:
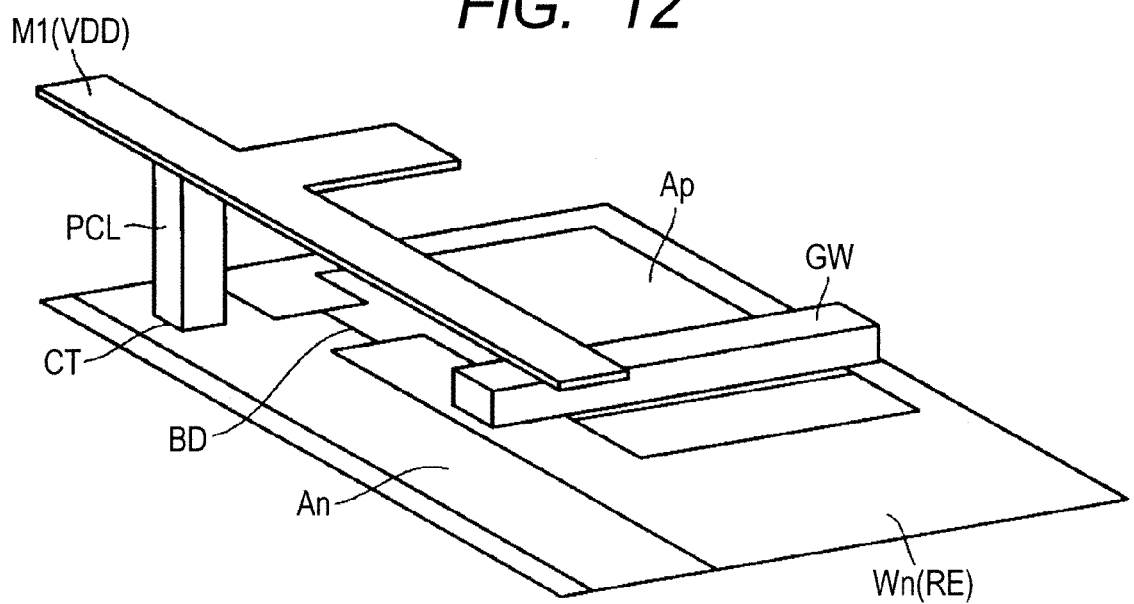
FIG. 12 is a perspective view as a comparative example of FIG. 11.

For instance, when the contact layer PCL having the contact portion SCT which is in contact with both the impurity region Ap for functional elements and the impurity region An for power potential is not formed as shown in FIG. 12 and the potential of a power terminal VDD is applied to the impurity region An for power potential, a depletion layer may be formed near the junction portion BD. This is because the p type impurity region Ap for functional elements and the n type impurity region An for power potential are joined together at the junction portion BD to form a pn junction.

When the depletion layer is formed, disconnection between the impurity region Ap for functional elements and the impurity region An for power potential may occur at the junction portion BD. Then, as shown in FIG. 11, the contact layer PCL having the contact portion SCT for electrically coupling the impurity region Ap for functional elements and the impurity region An for power potential is formed. Thereby, even when a large depletion layer is formed between the impurity region Ap for functional elements and the impurity region An for power potential, conduction between the impurity region Ap for functional elements and the impurity region An for power potential is secured by the contact layer PCL. Consequently, the semiconductor device SDV can be made small in size and highly integrated without any problem while the one-dimensional layout of the gate wires GW, the first metal wires M1 and the second metal wires M2 is maintained.

Further, for example, when the power wire (first metal wire) M1 is formed in contact with the uppermost part of the contact layer PCL having the contact portion SCT as shown in FIG. 11, if a large depletion layer is formed at the junction portion BD, electrical coupling between the impurity region An for power potential and the impurity region Ap for functional elements can be secured by coupling between the power wire M1 and the contact layer PCL having the contact portion SCT (for example, when the power wire M1 is electrically coupled to both the impurity region An for power potential and the impurity region Ap for functional elements). Therefore, electrical coupling between the impurity region An for power potential and the impurity region Ap for functional elements can be made more certain.

Particularly when the n type source/drain regions An are made of SiC, the p type source/drain regions Ap are made of SiGe, and the n type impurity region An for power potential and the p type impurity region Ap for power potential are made of Si, the junction portion BD becomes the boundary between SiC and Si and the boundary between SiGe and Si. Since SiC and Si are different from each other in crystal structure, electrical insulation readily occurs at the junction portion BD where they are joined together. This is because it is difficult to form a low-resistance silicide layer for smoothing conduction between SiC and Si. The same can be said of SiGe and Si.

Therefore, it is particularly effective that electrical coupling between the impurity region An for power potential and the impurity region Ap for functional elements should be ensured by forming the contact layer PCL as shown in FIG. 11.

Second Embodiment

This embodiment differs from First Embodiment in the structures of the impurity regions coupled by the contact layer PCL. A description is subsequently given of the configuration of this embodiment.

Figure 13:
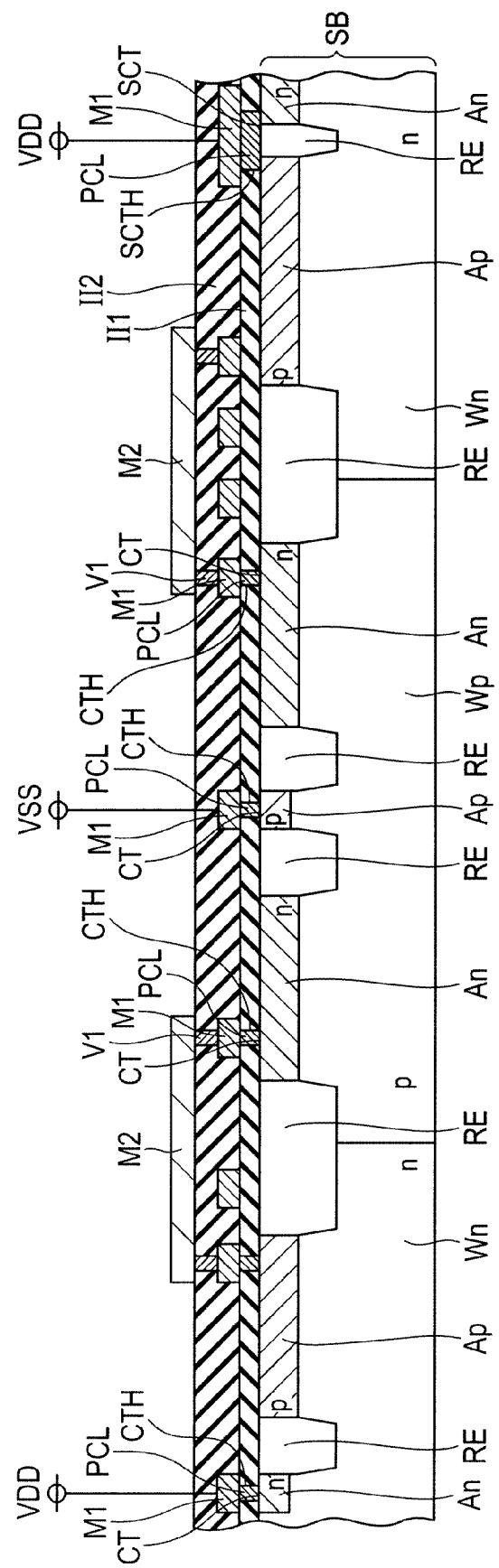
FIG. 13 is a schematic partial sectional view of a semiconductor device according to Second Embodiment of the present invention.
Figure 14:
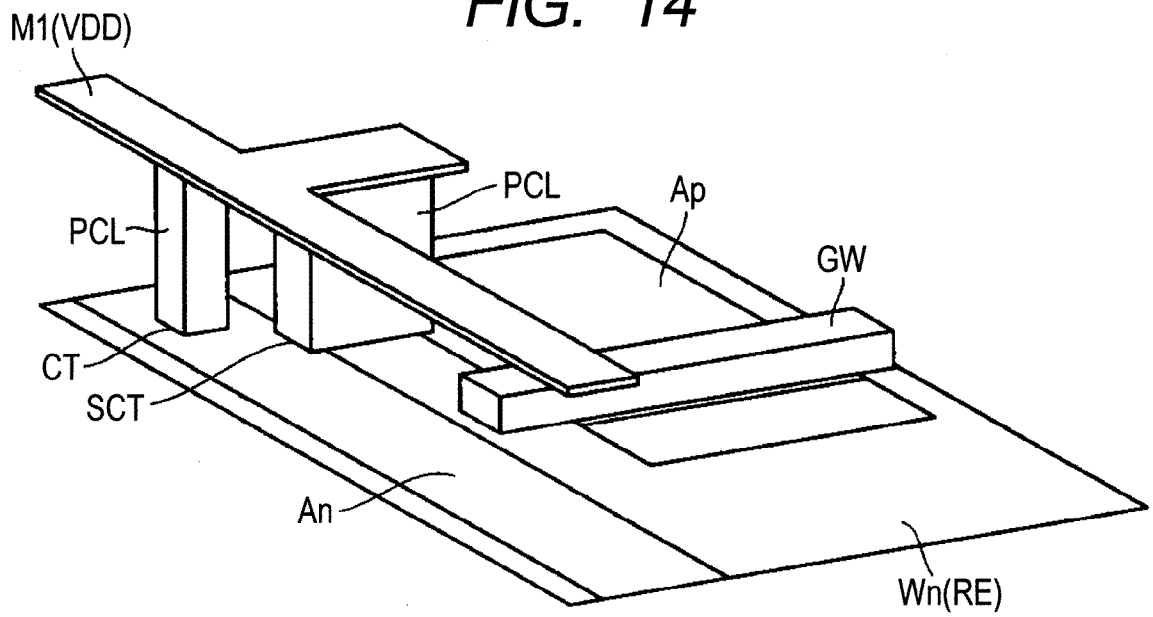
FIG. 14 is a detailed sectional view showing the configuration of an area in which an n type impurity region and a p type impurity region are coupled to each other in the semiconductor device according to Second Embodiment of the present invention.

FIG. 13 is a sectional view of the same part as in FIG. 7 of the standard cell of this embodiment. FIG. 14 is a perspective view of the same part as in FIG. 11 of the standard cell of this embodiment.

With reference to FIG. 13 and FIG. 14, FIG. 13 differs from FIG. 7 in that the p type active region Ap and the impurity region An for power potential are not joined together right below the contact portion SCT (contact region) and separate from each other. The difference between FIG. 14 and FIG. 11 is the same as the difference between FIG. 13 and FIG. 7. Although not shown, the same can be said of the n type active region An and the impurity region Ap for power potential to be formed in the p type well region Wp, and the n type active region An and the impurity region Ap for power potential are not joined together and separate from each other.

That is, in this embodiment, the junction portion BD is not formed between the impurity region for functional elements and the impurity region for power potential. However, even in this embodiment, as shown in FIG. 13 and FIG. 14, the contact portion SCT is in contact with both the p type active region Ap and the impurity region An for power potential which are separate from each other. That is, the p type active region Ap and the impurity region An for power potential are electrically coupled to each other by the contact layer PCL having the contact portion SCT.

Also in this case, to eliminate a problem such as the occurrence of the above junction leak, at least active regions (the impurity regions An and Ap for power potential, the n type source/drain regions An and the p type source/drain regions Ap) near the contact portion SCT are preferably higher than the Si surface which is the main surface of the semiconductor substrate SB on which functional elements are to be formed. To this end, it is preferred that the impurity region An for power potential and the n type source/drain regions An should be made of SiC and the impurity region Ap for power potential and the p type source/drain regions Ap should be made of SiGe.

Since the configuration of this embodiment is almost the same as the configuration of First Embodiment except for the above point, the same elements as in First Embodiment in FIG. 13 and FIG. 14 are given the same reference symbols, and their descriptions are not repeated.

Thus, the impurity region for functional elements and the impurity region for power potential which are electrically coupled to each other by the contact layer PCL having the contact portion SCT may not be joined together. Also in this case, conduction between the impurity region for functional elements and the impurity region for power potential is maintained by the contact layer PCL and the power wire M1 which is arranged in contact with and right above the contact layer PCL.

Second Embodiment of the present invention differs from First Embodiment of the present invention only in the above point. That is, configurations, conditions, procedures and effect which are not described for Second Embodiment of the present invention are the same as in First Embodiment.

Third Embodiment

This embodiment differs from First Embodiment only in the configurations of the contact layer PCL and the power terminal VDD. A description is subsequently given of the configuration of this embodiment.

Figure 15:
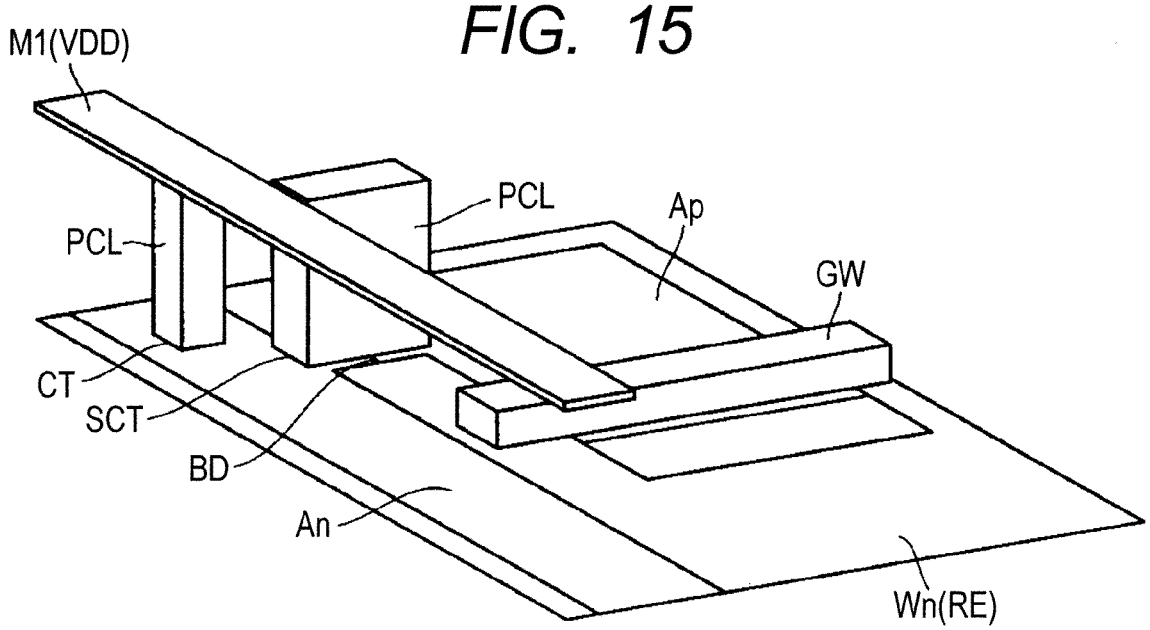
FIG. 15 is a detailed perspective view showing the configuration of an area in which an n type impurity region and a p type impurity region are coupled to each other in a semiconductor device according to Third Embodiment of the present invention.
Figure 16:
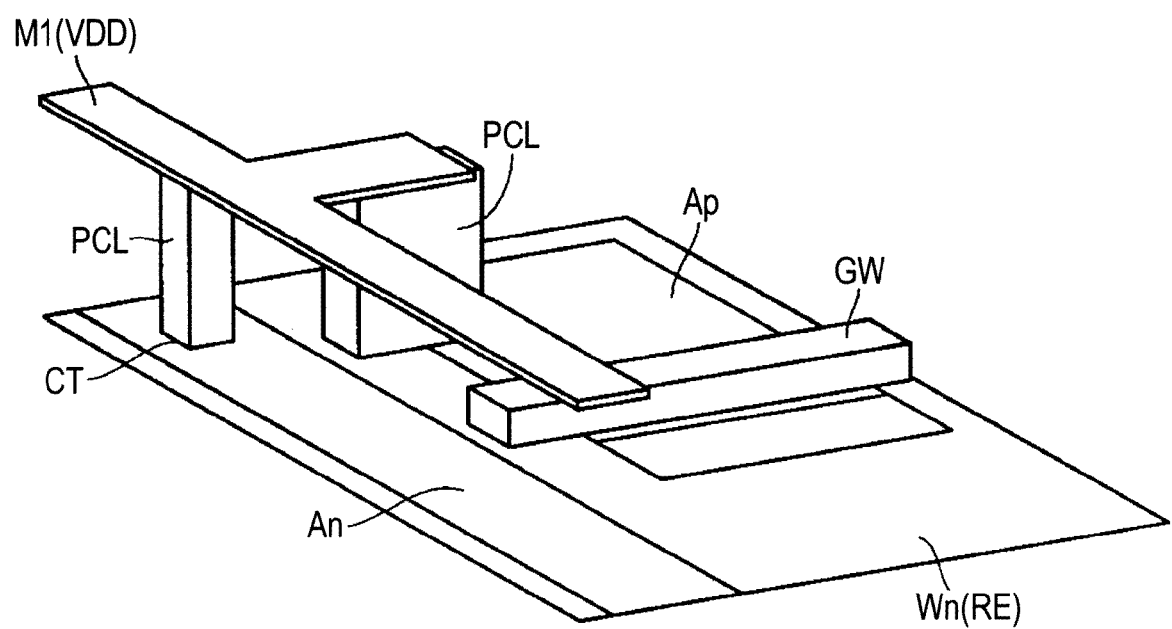
FIG. 16 is a detailed perspective view showing an example different from that of FIG. 15 of the area in which the n type impurity region and the p type impurity region are coupled to each other in the semiconductor device according to Third Embodiment of the present invention.

FIG. 15 and FIG. 16 are perspective views of the same part shown as in FIG. 11 of the standard cell of this embodiment.

With reference to FIG. 15, FIG. 15 differs from FIG. 11 in that the power wire M1 to which VDD is applied is not joined to the uppermost part of the contact layer PCL having the contact portion SCT. That is, the power wire M1 and the contact layer PCL having the contact portion SCT are separate from each other in the plan view.

Since the power wire M1 and the contact layer PCL are not joined together, the power wire M1 extends only in the direction of the impurity region for power potential and the branched part as shown in FIG. 11 (for coupling the contact layer PCL having the contact portion SCT) does not exist.

However, FIG. 15 is the same as FIG. 11 of First Embodiment except for the above points. That is, the impurity region Ap for functional elements and the impurity region An for power potential are coupled to each other at the junction portion BD. A contact layer PCL for electrically coupling the impurity region An for power potential and the impurity region Ap for functional elements is formed. That is, the lowermost part of the contact layer PCL is a contact portion SCT which is in contact with both the impurity region An for power potential and the impurity region Ap for functional elements.

Therefore, the impurity region Ap for functional elements and the impurity region An for power potential are electrically coupled to each other not by the power wire M1 but by the contact portion SCT. Consequently, like First Embodiment and Second Embodiment, conduction between the impurity region for functional elements and the impurity region for power potential is maintained.

As another example, the configuration shown in FIG. 16 differs from the configuration of FIG. 11 in that the impurity region Ap for functional elements and the impurity region An for power potential are not joined together and separate from each other over the main surface of the semiconductor substrate SB. The configuration shown in FIG. 16 also differs from the configuration of FIG. 11 in that the contact portion SCT is in contact with the p type active region Ap but not with the impurity region An for power potential. That is, in the contact portion SCT of FIG. 16, the p type active region Ap and the impurity region An for power potential are not electrically coupled to each other.

FIG. 16 differs from FIG. 11 in the above points. That is, in the structure of FIG. 16, only the power wire M1 is electrically coupled to the contact layer PCL having the contact portion SCT. Even in this configuration, as long as the power wire M1 and the contact layer PCL are coupled to each other, conduction between the n type region An and the p type region Ap is secured.

Third Embodiment of the present invention differs from First Embodiment of the present invention only in the above points. That is, configurations, conditions, procedures and effect which are not described for Third Embodiment of the present invention are the same as in First Embodiment of the present invention.

Fourth Embodiment

This embodiment differs from First Embodiment in the configuration of the contact layer PCL for coupling the impurity regions. A description is subsequently given of the configuration of this embodiment.

Figure 17:
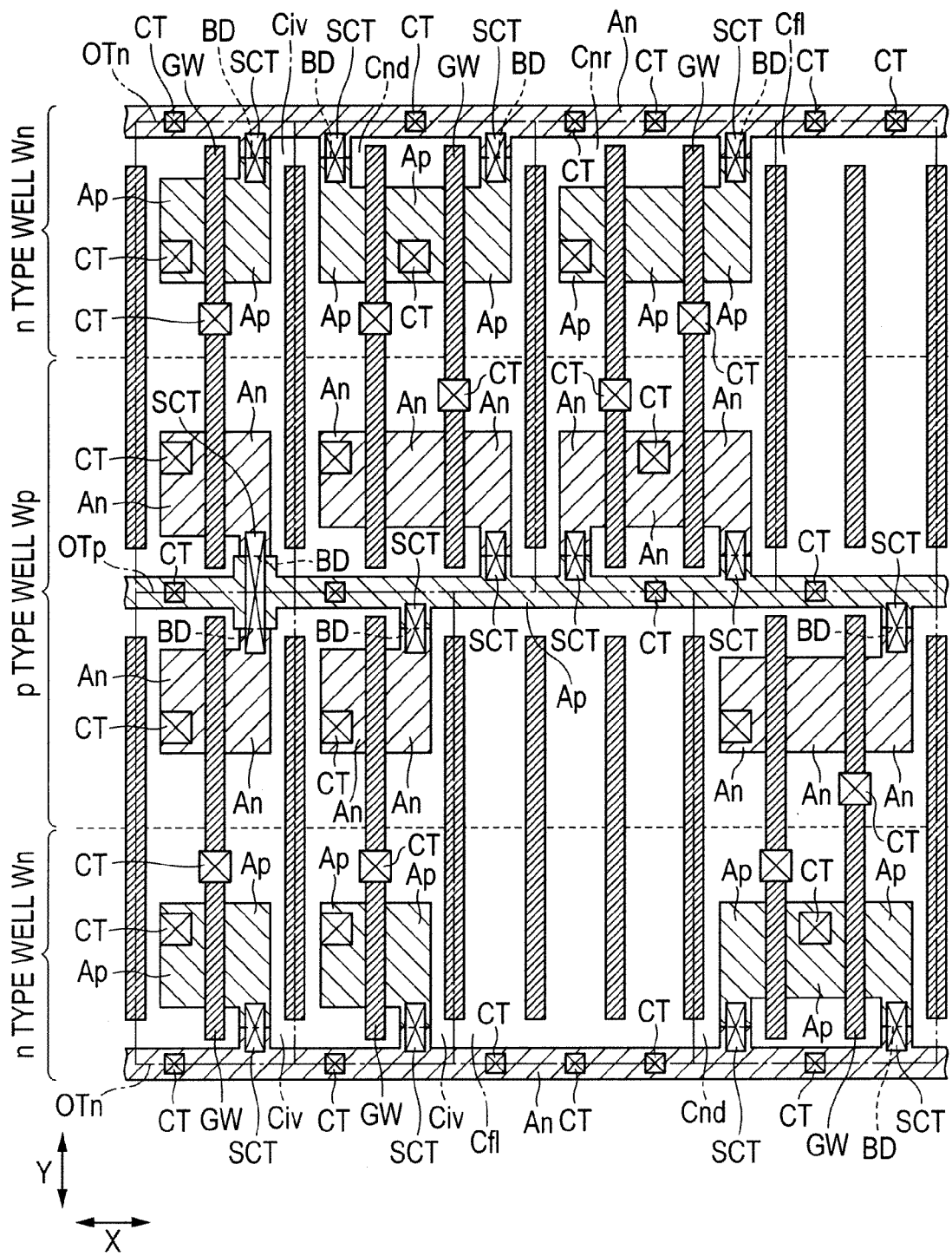
FIG. 17 is a schematic plan view showing the configurations of the first layer of a plurality of standard cells and the semiconductor substrate of a semiconductor device according to Fourth Embodiment of the present invention.
Figure 18:
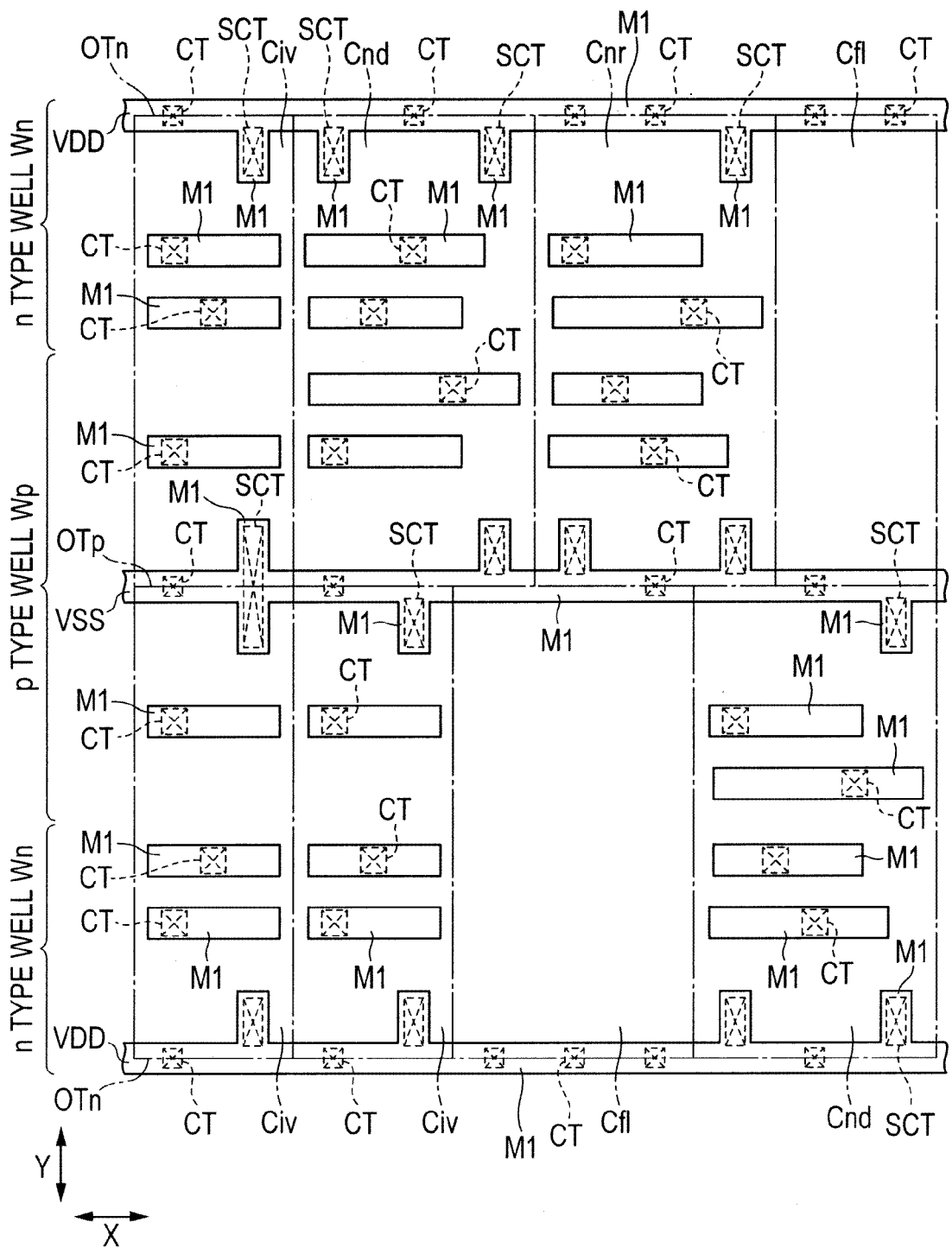
FIG. 18 is a schematic plan view showing the configuration of the second layer of the standard cells shown in FIG. 17.
Figure 19:
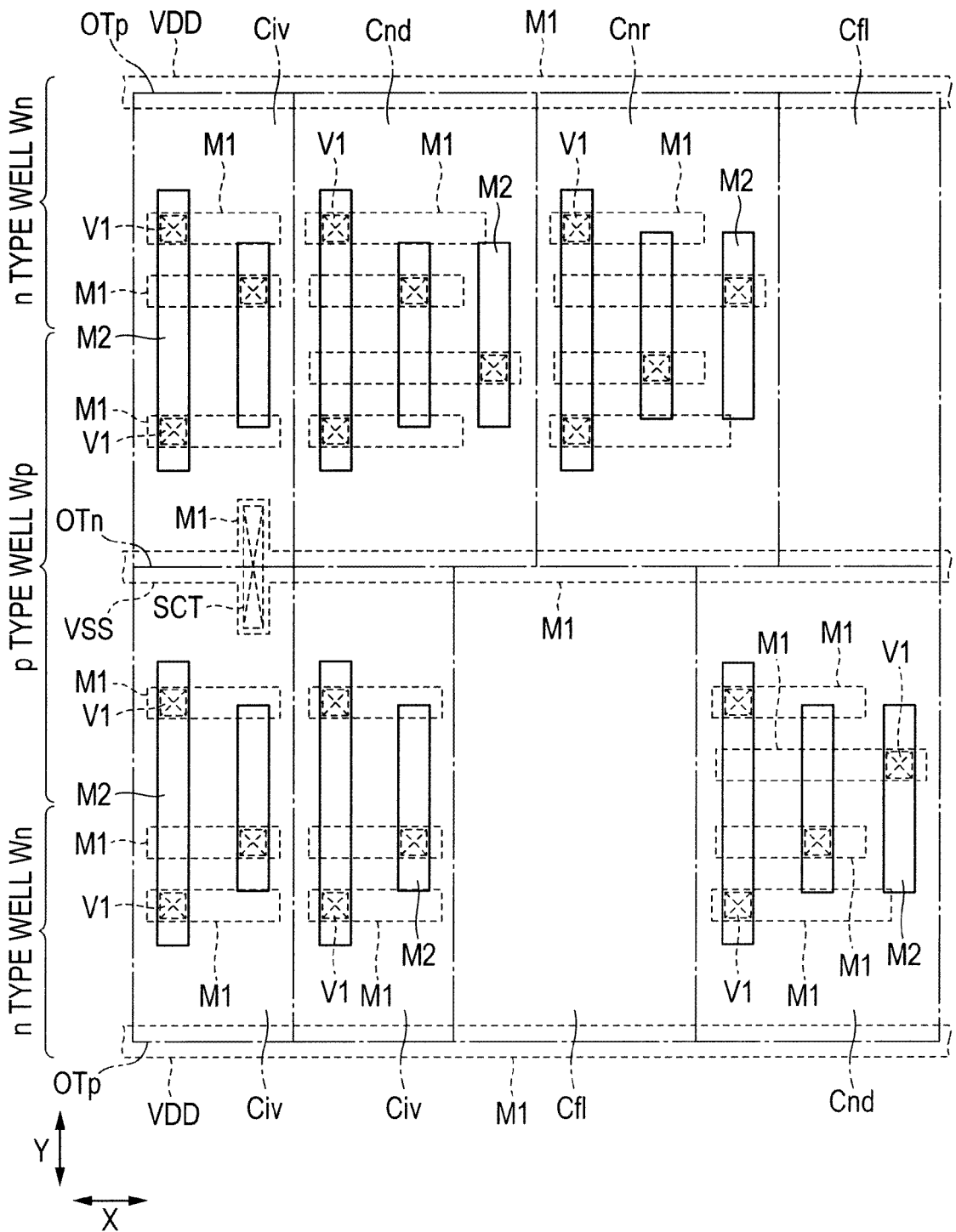
FIG. 19 is a schematic plan view showing the configuration of the third layer of the standard cells shown in FIG. 17.
Figure 20:
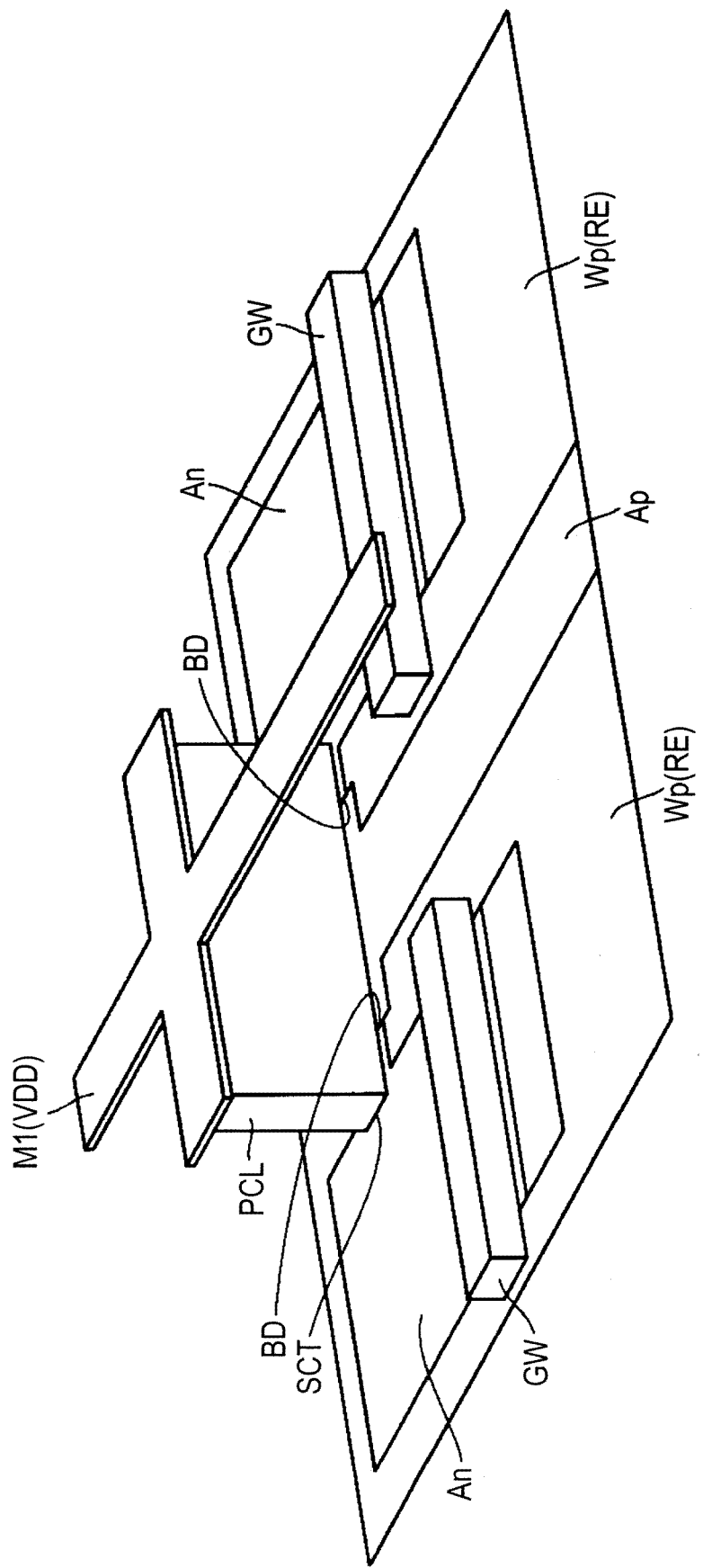
FIG. 20 is a detailed perspective view showing an example of an area in which an n type impurity region and a p type impurity region are coupled to each other in the semiconductor device according to Fourth Embodiment of the present invention.

FIG. 17 is a similar plan view to the plan view FIG. 4 of the standard cell of this embodiment. FIG. 18 is a similar plan view to the plan view of FIG. 5 of the standard cell of this embodiment. FIG. 19 is a similar plan view to the plan view of FIG. 6 of the standard cell of this embodiment. Further, FIG. 20 is a similar perspective view to the perspective view of FIG. 11 of the standard cell of this embodiment shown in FIGS. 17 to 19.

With reference to FIGS. 17 to 20, in this embodiment, a plurality of standard cells include first and second standard cells which are arranged adjacent to one another in a direction (Y direction) orthogonal to a direction (X direction) in which impurity regions An and Ap for power potential extend. Contact layers PCL are formed astride the first and second standard cells.

Stated more specifically, for example, the n type active region An (impurity region for functional elements) of a standard cell Civ (first standard cell) shown in the upper left of FIGS. 17 to 19 and the n type active region An of a standard cell Civ (second standard cell) shown in the lower left of FIGS. 17 to 19 which are arranged on both sides of the impurity region Ap for power potential as a power terminal VSS are coupled to each other by the contact layer PCL (contact conductive layer) having a contact portion SCT in the Y direction. That is, the n type active region An and the impurity region Ap for power potential of the first standard cell Civ and the n type active region An of the second standard cell Civ are coupled to one another by the contact layer PCL.

The n type active region An and the impurity region Ap for power potential of the first standard cell Civ and the n type active region An and the impurity region Ap for power potential of the second standard cell Civ which are coupled to each other by one contact layer PCL are joined together at the junction portion BD. The above three regions An, Ap and An are in contact with the contact portion SCT of the above contact layer PCL. The power wire M1 to which VSS is applied is joined to the contact layer PCL at the uppermost part of the above contact layer PCL.

Owing to this configuration, the impurity region Ap for power potential which extends below the power wire M1 as the power terminal VSS and the n type active regions An on both sides (in the Y direction) of the impurity region Ap are coupled to one another by one contact layer PCL. Therefore, the above three regions An, Ap and An are electrically coupled to one another by a more simple wiring structure.

Figure 21:
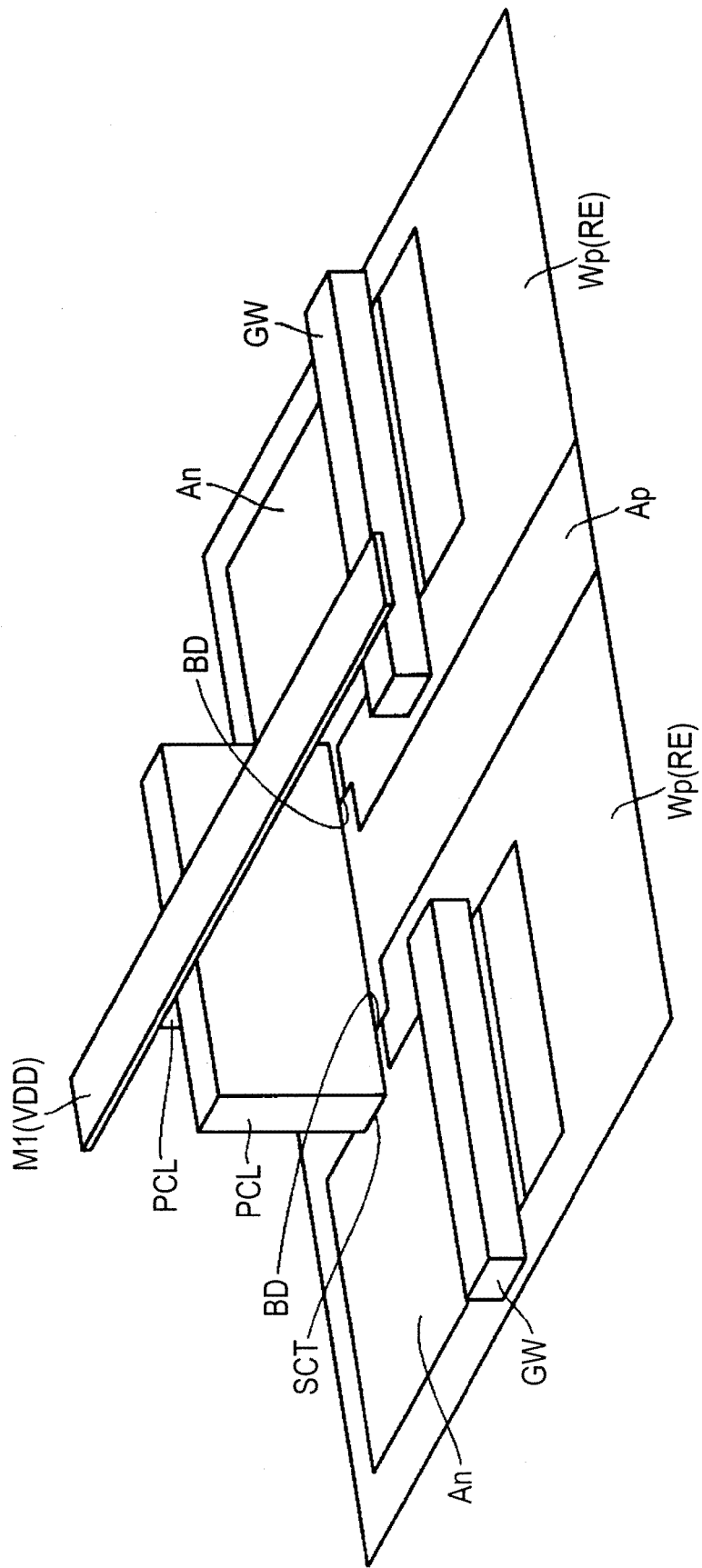
FIG. 21 is a detailed perspective view showing an example different from that of FIG. 20 of the area in which the n type impurity region and the p type impurity region are coupled to each other in the semiconductor device according to Fourth Embodiment of the present invention.

With reference to FIG. 21, FIG. 21 differs from FIG. 20 in that the power wire M1 to which VSS is applied does not diverge in a direction orthogonal to a direction extending over the impurity region Ap for power potential.

Also in this case, when the power wire M1 is coupled to the contact layer PCL (at the same position as the impurity region Ap for power potential in the plan view) over the impurity region Ap for power potential, the impurity region Ap for power potential and the n type active regions An are coupled to each other by the contact layer PCL (contact portion SCT). Therefore, the above three regions An, Ap and An are electrically coupled to one another.

Although not shown, when the contact layer PCL is made conductive to the power wire M1 as in FIG. 16 even in this embodiment, if the contact layer PCL (contact portion SCT) is arranged at a position where it does not couple the above three regions An, Ap and An to one another, it can electrically couple the above three regions An Ap and An in another area.

Since the configuration of this embodiment is almost the same as the configuration of First Embodiment except for the above points, the same elements as in First Embodiment shown in FIGS. 17 to 21 are given the same reference symbols, and their descriptions are not repeated.

Fourth Embodiment of the present invention differs from First Embodiment of the present invention only in the above points. That is, configurations, conditions, procedures and effect which are not described for Fourth Embodiment of the present invention are all the same as in First Embodiment of the present invention.

Fifth Embodiment

This embodiment differs from First Embodiment in the configurations of the impurity regions for power potential and the gate wires GW. A description is subsequently given of this embodiment.

Figure 22:
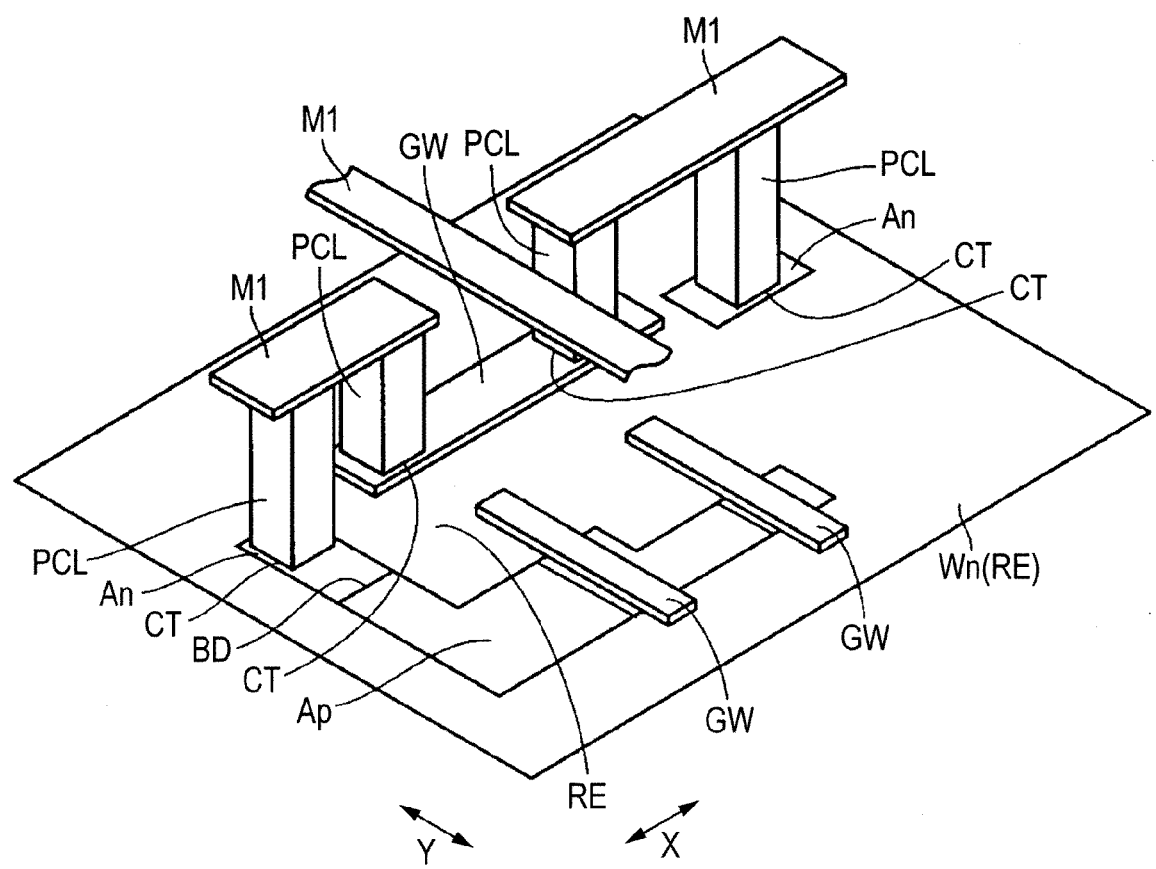
FIG. 22 is a detailed perspective view showing an example of an area in which an n type impurity region and a p type impurity region are coupled to each other in a semiconductor device according to Fifth Embodiment of the present invention.
Figure 23:
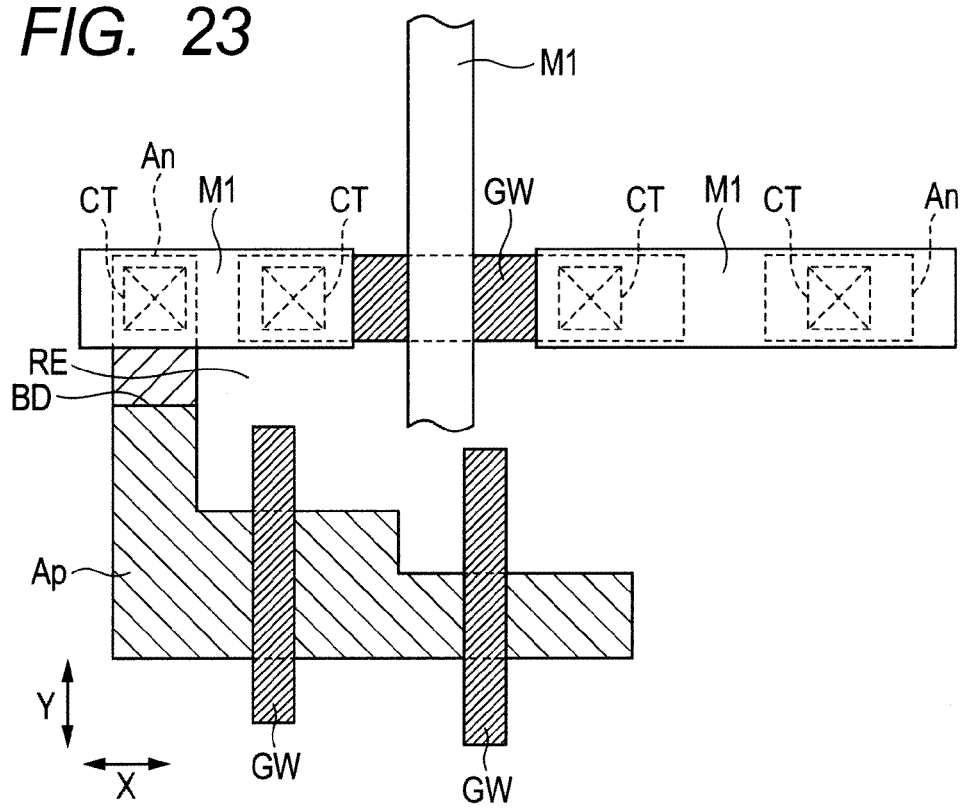
FIG. 23 is a schematic partial plan view showing the configuration of FIG. 22.

FIG. 22 is a similar perspective view to the perspective view of FIG. 11 of the standard cell of this embodiment. FIG. 23 is a plan view of FIG. 22. Further, FIG. 24 is a plan view of a relatively lower layer (excluding the power wire M1 in FIG. 23) of the standard cell shown in FIG. 22 and FIG. 23 like FIG. 4.

Figure 24:
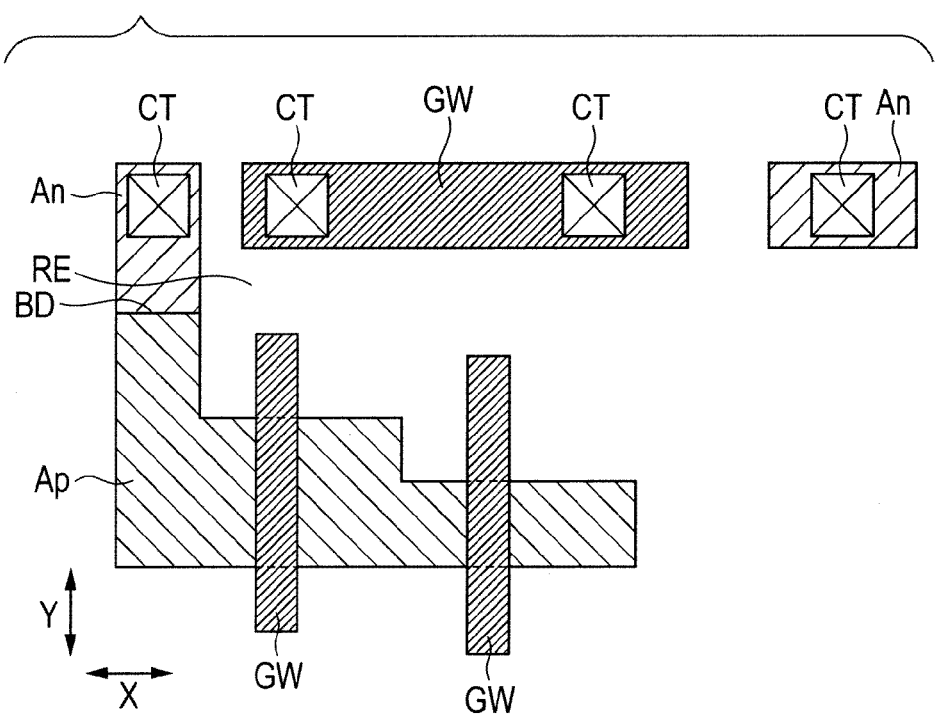
FIG. 24 is a schematic partial plan view showing the configuration of a lower layer shown in FIG. 22.

With reference to FIGS. 22 to 24, in the standard cell of this embodiment, a pair of p type source/drain regions Ap of a MIS transistor are formed over the main surface of the n type well region An of the semiconductor substrate SB (see FIG. 7) with a space therebetween. The gate wires GW (gate electrodes) of the above MIS transistor extending in the longitudinal direction of FIG. 23 and FIG. 24 are formed in such a manner that they extend over an area between the pair of p type source/drain regions Ap.

An n type impurity region An for power potential which is joined to the p type source/drain regions Ap at the junction portion BD is arranged next to the p type source/drain regions Ap. The width in the X direction in the plan view of the n type impurity region An for power potential and the width in the X direction in the plan view of the p type source/drain regions Ap near the junction portion BD are substantially the same. Above the impurity region An for power potential, especially above the gate wires GW is arranged a power wire (first metal wire) M1. This power wire M1 is for supplying VDD or VSS potential.

The impurity region An for power potential and the power wire M1 are not elongated in the X direction and are divided into two.

One (first power wire) of the two power wires M1 extending in the X direction and the other (second power wire) are electrically coupled to each other by contact layers PCL through a conductive layer GW for coupling extending in the X direction like the power wires M1. The two power wires M1 and the conductive layer GW for coupling overlap with each other in the plan view in the contact layers PCL. The conductive layer GW for coupling extending in the X direction is made of the same material as the above-described gate wires GW extending in the Y direction. The conductive layer GW for coupling extending in the X direction and the gate wires GW extending in the Y direction are separated from each other from the same layer.

One of the two impurity regions An for power potential is electrically coupled to the first power wire M1 and the other impurity region An is electrically coupled to the second power wire M1 by the contact layers PCL.

The first and second power wires M1 and the impurity regions An for power potential are electrically coupled to each other by the contact layers PCL having a contact portion CT. However, the first and second power wires M1 and the impurity regions An for power potential may be electrically coupled to each other by the contact layer PCL having the contact portion SCT as shown in First Embodiment.

Further, in this embodiment, a wire layer M1 separated from the same layer as the power wires M1 is formed between the separate power wires M1. This wire layer M1 extends in the Y direction and is situated between the first and second power wires M1 extending in the X direction.

Figure 25:
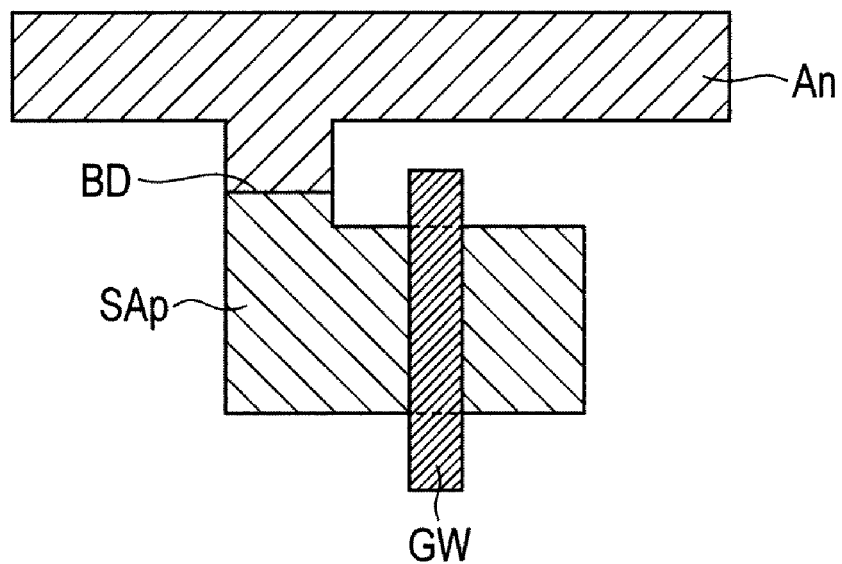
FIG. 25 is a schematic plan view showing that an active region and an impurity region for power potential made of different materials are coupled to each other.

The p type source/drain regions Ap and the n type impurity regions An for power potential are preferably made of Si, for example. However, when the p type source/drain regions Ap are made of SiGe in place of Si, with reference to FIG. 25, the chances of the occurrence of disconnection at the junction portion BD between the p type source/drain regions SAp made of SiGe and the linear n type impurity region An for power potential made of Si become high. This is because it is difficult to form a low-resistance silicide layer for smoothing conduction between the contact portion CT or SCT and the contact layer PCL over the main surfaces of the p type source/drain regions SAp and the n type impurity region An for power potential when they are made of different materials.

When the p type source/drain regions SAp are made of SiGe, the current drive capability of the p type source/drain regions SAp improves. However, when disconnection occurs at the junction portion BD, the p type source/drain regions SAp change their shapes in the plan view and the function of the p type source/drain regions SAp may deteriorate.

Figure 26:
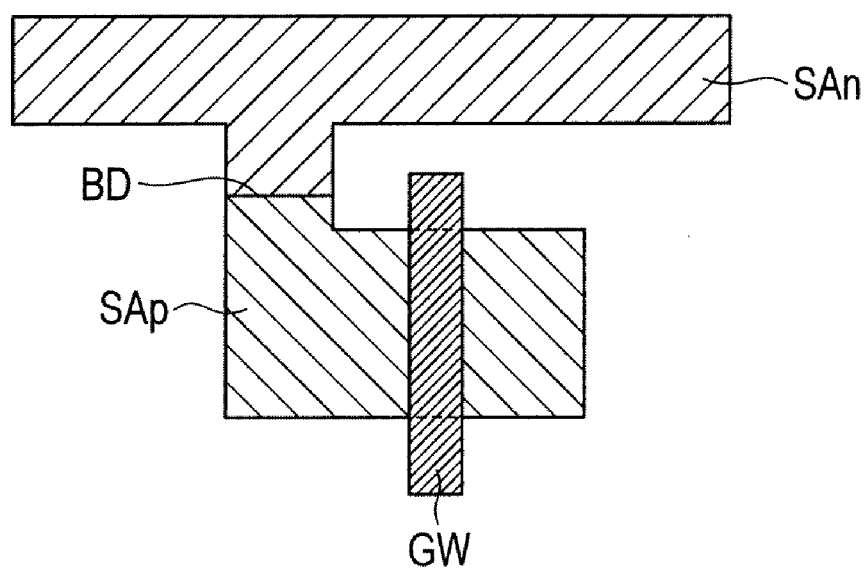
FIG. 26 is a schematic plan view showing that the active region and the impurity region for power potential made of the same material are coupled to each other.

Then, to make the active regions and the impurity region for power potential from the same material, for example, when the impurity region SAn for power potential is composed of a SiGe layer in addition to the p type source/drain regions SAp as shown in FIG. 26, disconnection may occur in the linear (elongated) impurity region SAn for power potential made of SiGe.

However, in this embodiment, the n type impurity region for power potential is divided in the X direction and not linear (elongated). Therefore, both the n type impurity region for power potential and the p type active region may be made of SiGe. When both of them are made of SiGe, standard cells having improved current drive capability and suppressed disconnection can be provided. In this case, the conductive layer GW for coupling extending in the X direction is preferably a metal gate containing titanium or copper. In this case, the gate wires GW become similar metal gates.

Since the configuration of this embodiment is almost the same as the configuration of First Embodiment except for the above points, the same elements as in First Embodiment in FIGS. 22 to 28 are given the same reference symbols, and their descriptions are not repeated.

A description is subsequently given of the function and effect of the semiconductor device SDV of this embodiment with reference to FIGS. 23 to 24 and FIGS. 27 and 28.

Figure 27:
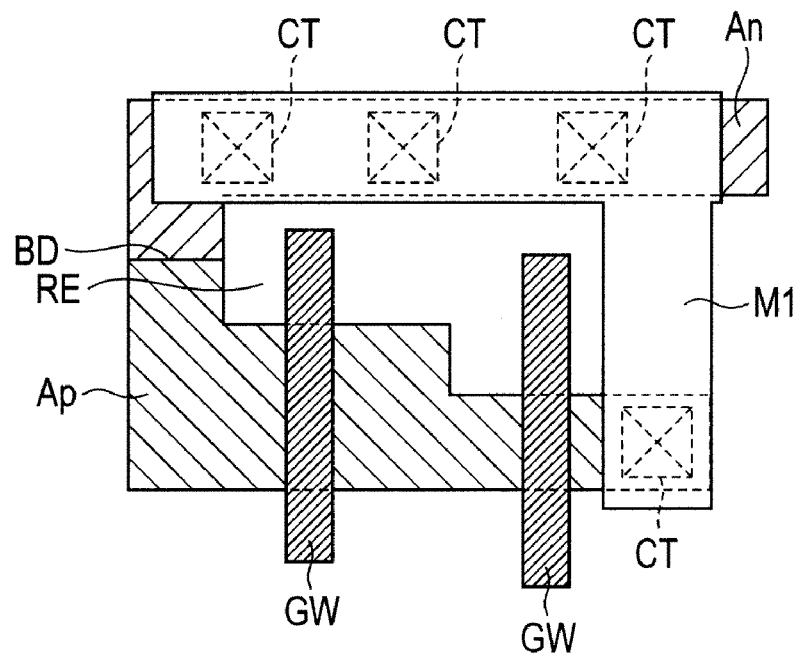
FIG. 27 is a partial plan view as a comparative example of FIG. 23.
Figure 28:
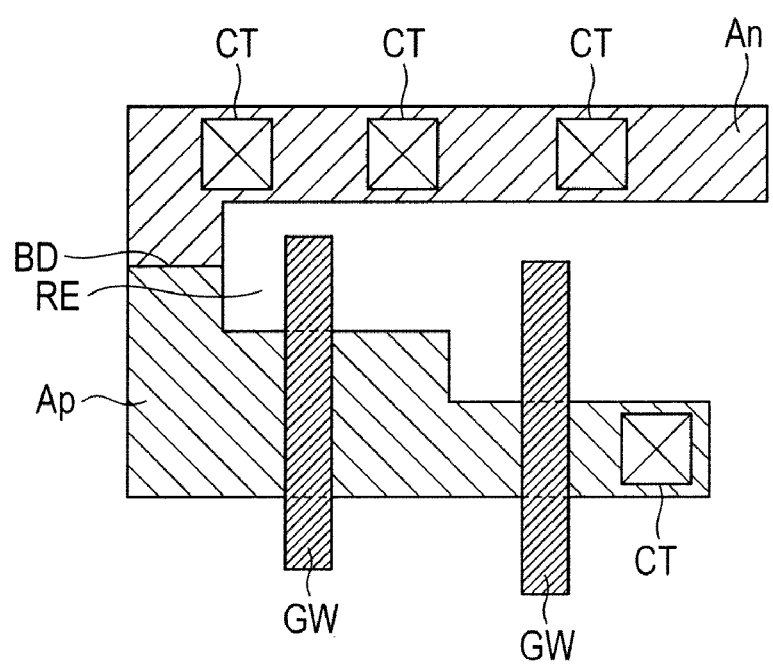
FIG. 28 is a partial plan view as a comparative example of FIG. 24.

As shown in FIG. 27 showing a comparative example to this embodiment and FIG. 28 in which the power wire M1 in FIG. 27 is not shown, an STI region RE surrounded by the p type source/drain regions Ap as source/drain regions and the n type impurity region An for power potential in three directions in the plan view is formed. Although an insulating layer is buried in the STI region RE, as long as the STI region RE is surrounded by An and Ap in the three directions, it is difficult to bury insulating layers II1 and II2 in the STI region RE.

Therefore, like this embodiment, the impurity region An for power potential is not elongated in the X direction but divided. Thereby, the STI region RE in FIG. 23 and FIG. 24 is surrounded by the p type source/drain regions Ap in two directions. Since the STI region RE is not surrounded by An and Ap in the other two directions, as compared with the configuration shown in FIG. 27 and FIG. 28, it is easy to bury the insulating layer II1 in the STI region RE.

Since it is easy to bury the insulating layer II1 in the STI region RE, variations in the shapes in the plan view of the surrounding p type source/drain regions Ap and the n type impurity region An for power potential can be suppressed. That is, the performances of the formed MIS transistors and the standard cells are stabilized.

Since the impurity region An for power potential is not elongated in the X direction, the power wire M1 formed over the impurity region An for power potential does not need to be elongated in the X direction. That is, the degrees of freedom of the length in the X direction and the location for dividing the power wire M1 increase.

Further, as the power wire M1 is divided into two (first and second power wires), a power wire M1 extending in the Y direction can be arranged in the divided area. When FIG. 23 and FIG. 27 are compared with each other, the position of the power wire M1 extending in the Y direction is different. As described above, the degree of layout freedom of the power wire M1 formed by one-dimensional layout having no bending and curving increases.

When the impurity region An for power potential is elongated as shown in FIG. 27 and FIG. 28 as described above, a trouble may occur by using SiGe in the impurity region An for power potential. However, since the impurity region An for power potential is divided short like this embodiment, SiGe can be used in the impurity region An for power potential. If the p type active region Ap is made of SiGe, the current drive function improves and a high-performance standard cell in which disconnection at the junction portion BD is suppressed can be provided.

The configuration of an area including the impurity region An for power potential and the p type active region Ap arranged below the power wire M1 for supplying the potential of the power terminal VDD has been described above. However, in the area including the impurity region Ap for power potential and the n type active region An arranged below the power wire M1 for supplying the potential of the power terminal VSS (see FIG. 4), the same structure as above may be formed.

The semiconductor device of the present invention may be configured by suitably combining the above embodiments. In this case, the effects described for the combined embodiments can be provided likewise. It should be understood that the embodiments disclosed herein are illustrative and not restrictive. Since the scope of the present invention is defined by the appended claims rather than by the description preceding them, and all changes that fall within meets and bounds of the claims, or equivalence of such meets and bounds are therefore intended to be embraced by the claims.

The present invention can be especially advantageously applied to a semiconductor device having standard cells.

What is claimed is:

1. A semiconductor device having a plurality of standard cells, comprising:
   a semiconductor substrate having a main surface;
   a first conductive impurity region for functional elements which is formed over the main surface of the semiconductor substrate in at least one of the standard cells and forms functional elements;
   a second conductive impurity region for power potential which is formed over the main surface of the semiconductor substrate in the at least one of the standard cells and to which a power potential is applied;
   an insulating layer which is formed over the main surface of the semiconductor substrate and has throughholes reaching the main surface of the semiconductor substrate; and
   a conductive layer for contact which is formed in the throughholes of the insulating layer,
   wherein the conductive layer for contact is formed astride the impurity region for functional elements and the impurity region for power potential so as to electrically couple the impurity region for functional elements and the impurity region for power potential therethrough.

2. The semiconductor device according to claim 1, wherein the impurity region for functional elements and the impurity region for power potential are coupled to each other right below a contact region where the conductive layer for contact is in contact with the main surface of the semiconductor substrate.

3. The semiconductor device according to claim 1, wherein the impurity region for functional elements and the impurity region for power potential are not joined together and separate from each other right below the contact region where the conductive layer for contact is in contact with the main surface of the semiconductor substrate in the plan view.

4. The semiconductor device according to claim 1 further comprising a power wire extending over the impurity region for power potential,
    wherein the power wire is joined to the conductive layer for contact.

5. The semiconductor device according to claim 1, further comprising a power wire extending over the impurity region for power potential,
    wherein the power wire is not joined to the conductive layer for contact and is separate from the conductive layer for contact.

6. The semiconductor device according to claim 1,
    wherein the standard cells include first and second standard cells which are arranged adjacent to each other in a direction orthogonal to a direction where the impurity region for power potential extends, and
    wherein a contact region where the conductive layer for contact is in contact with the main surface of the semiconductor substrate is arranged astride the first and second standard cells.

7. The semiconductor device according to claim 1, wherein the impurity region for functional elements is made of either one of SiGe and SiC and the impurity region for power potential is made of Si.

8. The semiconductor device according to claim 2, wherein the contact region is situated within an area where the impurity region for power potential and the impurity region for functional elements are formed without being projected from the area over the main surface of the semiconductor substrate in a plan view.

* * * * *